United States Patent
Yuasa

(10) Patent No.: US 10,546,981 B2
(45) Date of Patent: Jan. 28, 2020

(54) LIGHT EMITTING DEVICE AND METHOD OF MANUFACTURING LIGHT EMITTING DEVICE

(71) Applicant: NICHIA CORPORATION, Anan-shi (JP)

(72) Inventor: Taiki Yuasa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/044,433

(22) Filed: Jul. 24, 2018

(65) Prior Publication Data

US 2019/0035987 A1    Jan. 31, 2019

(30) Foreign Application Priority Data

Jul. 25, 2017   (JP) ................................. 2017-144022

(51) Int. Cl.

| | |
|---|---|
| *H01L 33/60* | (2010.01) |
| *H01L 33/50* | (2010.01) |
| *H01L 33/62* | (2010.01) |
| *H01L 33/48* | (2010.01) |
| *H01L 33/28* | (2010.01) |
| *H01L 33/32* | (2010.01) |

(52) U.S. Cl.
CPC .......... *H01L 33/505* (2013.01); *H01L 33/486* (2013.01); *H01L 33/50* (2013.01); *H01L 33/502* (2013.01); *H01L 33/60* (2013.01); *H01L 33/62* (2013.01); *H01L 33/28* (2013.01); *H01L 33/32* (2013.01); *H01L 2933/0041* (2013.01); *H01L 2933/0058* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 2004/0150991 A1* | 8/2004 | Ouderkirk | ............... H01L 33/46 362/231 |
| 2006/0066210 A1* | 3/2006 | Ng | .......................... B82Y 10/00 313/486 |
| 2013/0181243 A1* | 7/2013 | Wu | ....................... H01L 33/505 257/98 |
| 2014/0185299 A1 | 7/2014 | Sanga et al. | |
| 2015/0155450 A1 | 6/2015 | Oka | |
| 2017/0331003 A1* | 11/2017 | Cheng | ................... H01L 33/007 |

(Continued)

FOREIGN PATENT DOCUMENTS

| | | |
|---|---|---|
| JP | 11-145519 | 5/1999 |
| JP | 2007-142268 | 6/2007 |
| JP | 2008-311532 | 12/2008 |

(Continued)

*Primary Examiner* — Minh Loan Tran
(74) *Attorney, Agent, or Firm* — Mori & Ward, LLP

(57) ABSTRACT

A light emitting device includes: a light emitting element emitting first light; a fluorescent material layer disposed on the light emitting element and excited by the first light to emit second light being longer in wavelength than the first light; a reflective film disposed on the fluorescent material layer to reflect the first light and transmit the second light; a light-transmissive member disposed on the reflective film; and an absorbing layer disposed on the light-transmissive member to absorb the first light.

25 Claims, 15 Drawing Sheets

(56) References Cited

U.S. PATENT DOCUMENTS

2018/0019384 A1* 1/2018 Abe ................ G02B 5/285

FOREIGN PATENT DOCUMENTS

| JP | 2012-174985 | 9/2012 |
| JP | 2014-130911 | 7/2014 |
| JP | 2015-106641 | 6/2015 |
| WO | WO 2011/004795 | 1/2011 |

* cited by examiner

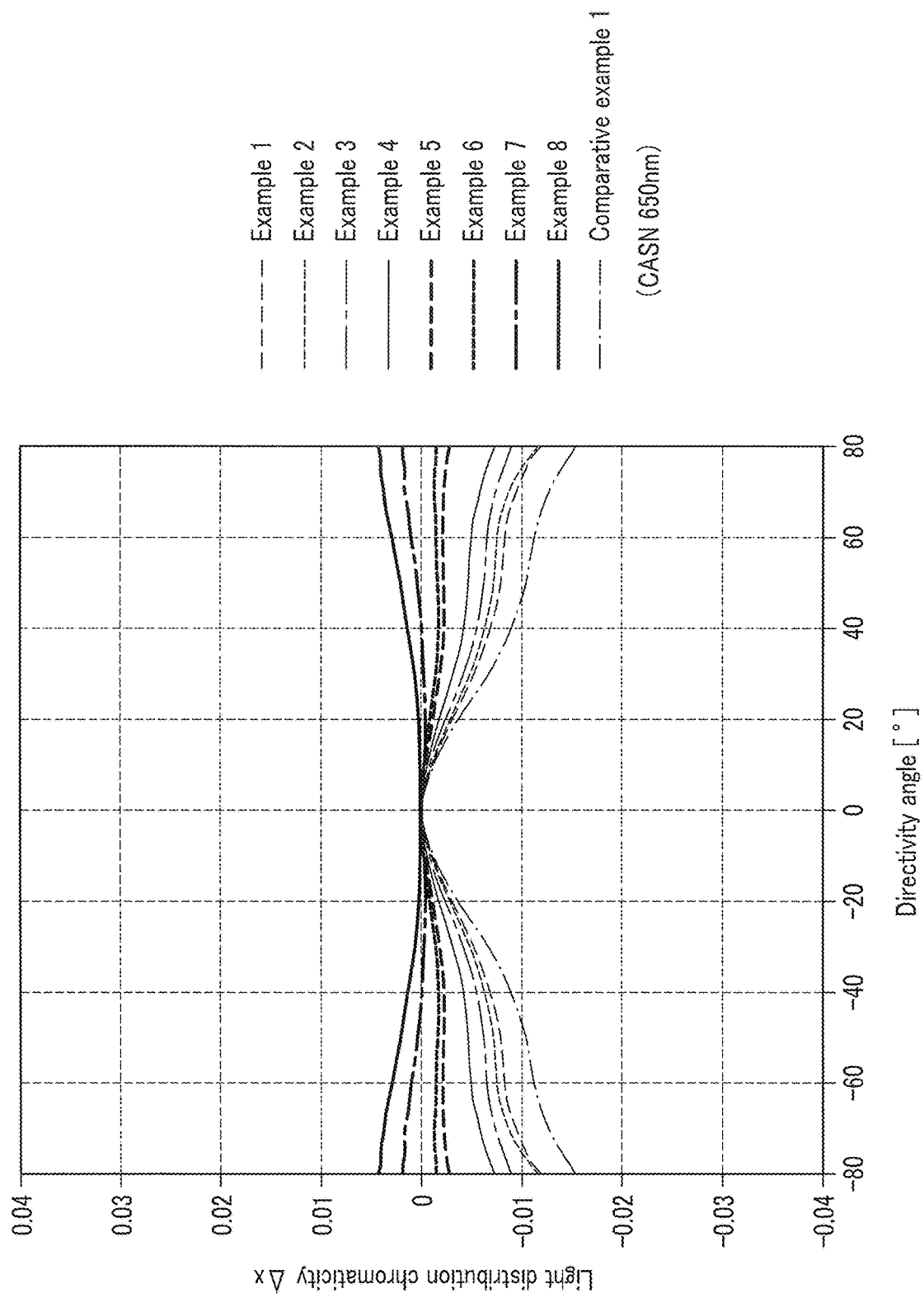

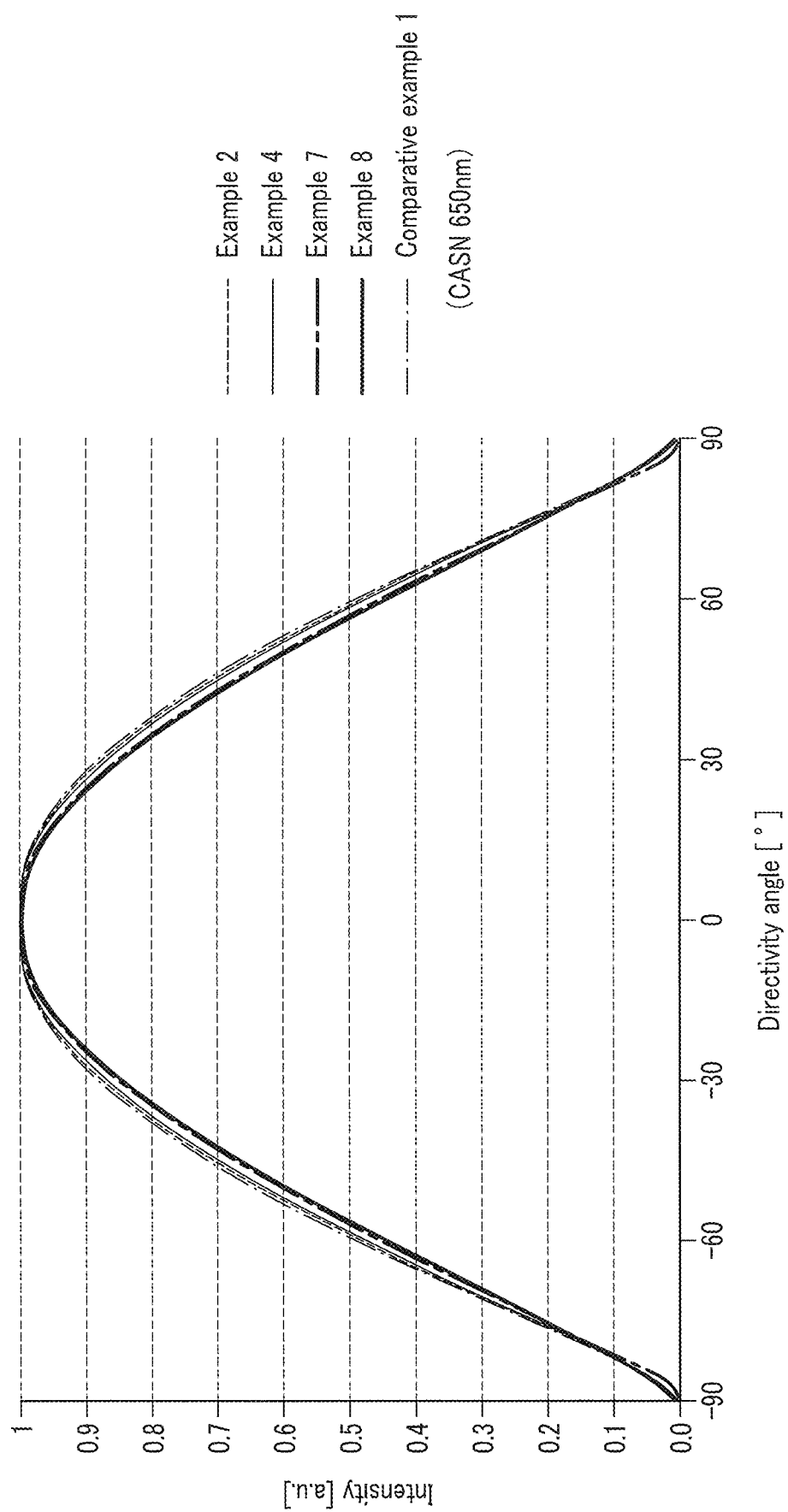

Example 4

Example 7

Comparative example 1

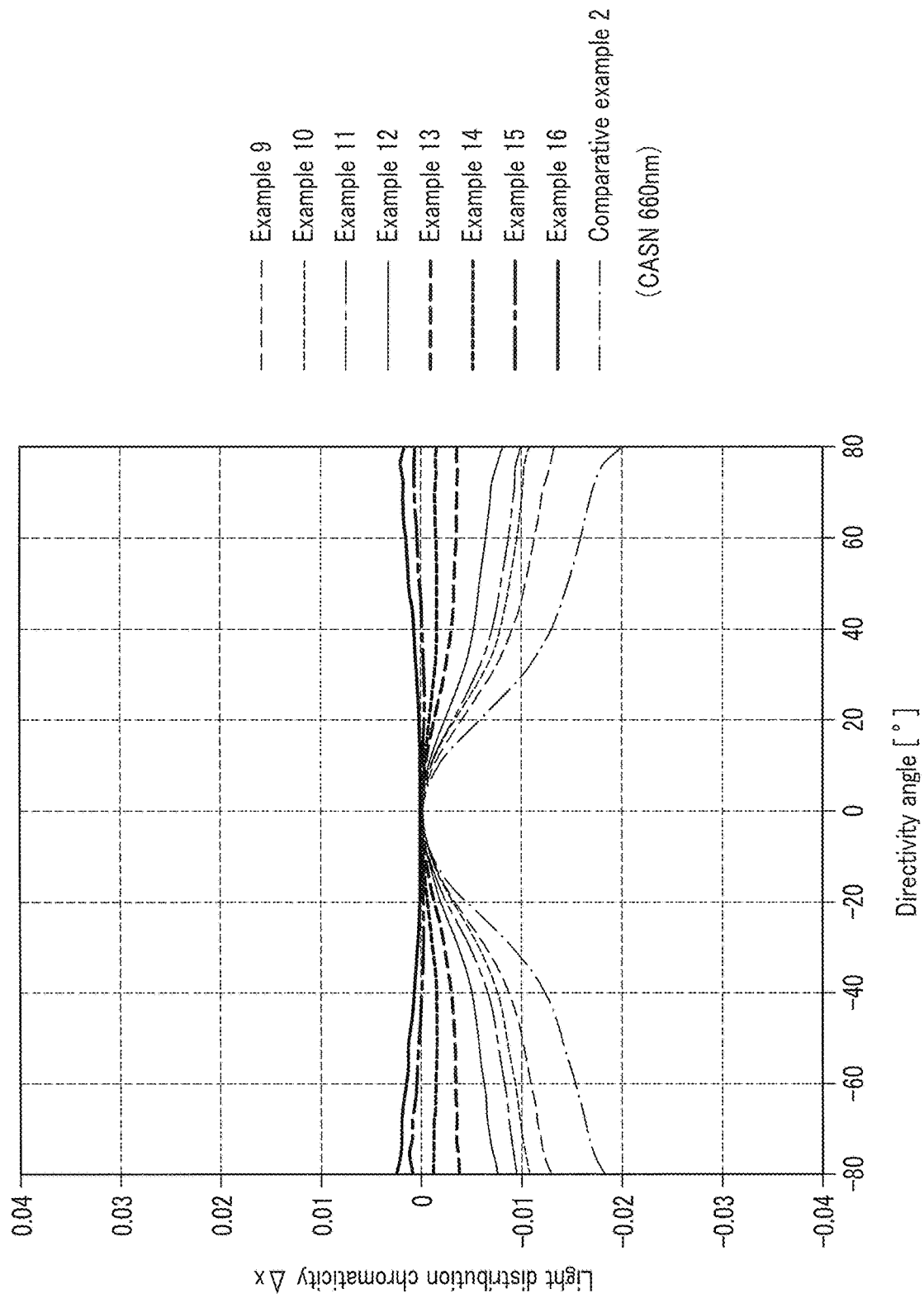

LIGHT EMITTING DEVICE AND METHOD OF MANUFACTURING LIGHT EMITTING DEVICE

CROSS-REFERENCE TO RELATED APPLICATIONS

The present application claims priority under 35 U.S.C. § 119 to Japanese Patent Application No. 2017-144022, filed Jul. 25, 2017, the contents of which are hereby incorporated by reference in their entirety.

BACKGROUND

1. Technical Field

The present disclosure relates to a light emitting device and a method of manufacturing a light emitting device.

2. Description of Related Art

Conventionally, a red-color LED has been used as a light source in many applications including a tail light of an automobile, traffic signs, a backlight of a liquid crystal panel and the like. On the other hand, it is known that a red-color LED made of a quaternary material is poor in temperature characteristics than a green-color LED or a blue-color LED, with its output being reduced under high temperatures.

Accordingly, in recent years, there has been proposed a light emitting device with improved light emission efficiency of red-color light while dispensing with a red-color LED. For example, Japanese Patent Publication No. 2014-130911 proposes a light emitting device with improved light emission efficiency of red-color light, by providing a dielectric multilayer film reflecting blue-color light between a blue-color LED and a fluorescent material containing layer containing a red-color fluorescent material, so that the red-color fluorescent material is efficiently excited by the blue-color light, improving efficiency of emitting red-color light.

SUMMARY

A light emitting device according to an embodiment of the present disclosure includes: a light emitting element that emits first light; a fluorescent material layer disposed on the light emitting element, the fluorescent material layer being excited by the first light to emit second light being longer in wavelength than the first light; a reflective film disposed on the fluorescent material layer to reflect the first light and transmit the second light; a light-transmissive member disposed on the reflective film; and an absorbing layer disposed on the light-transmissive member to absorb the first light.

A method of manufacturing a light emitting device according to an embodiment of the present disclosure includes: providing a light emitting element having a fluorescent material layer formed at its upper surface and having electrodes formed at its lower surface, and a light-transmissive member having a reflective film formed; mounting the light emitting element on a base member via the electrodes; disposing the light-transmissive member on the light emitting element so that the reflective film and the fluorescent material layer are in contact with each other; and disposing an absorbing layer on the light-transmissive member.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

FIG. 8 is a graph showing the relationship between directivity angles and light distribution chromaticity in relation to Examples 1 to 8 and Comparative Example 1;

FIG. 10 is a graph showing the relationship between directivity angles and light intensity in relation to Examples 2, 4, 7, 8 and Comparative Example 1;

FIG. 12 is a graph showing the relationship between directivity angles and light distribution chromaticity in relation to Examples 9 to 16 and Comparative Example 2;

DETAILED DESCRIPTION OF EMBODIMENT

Figure 1A:
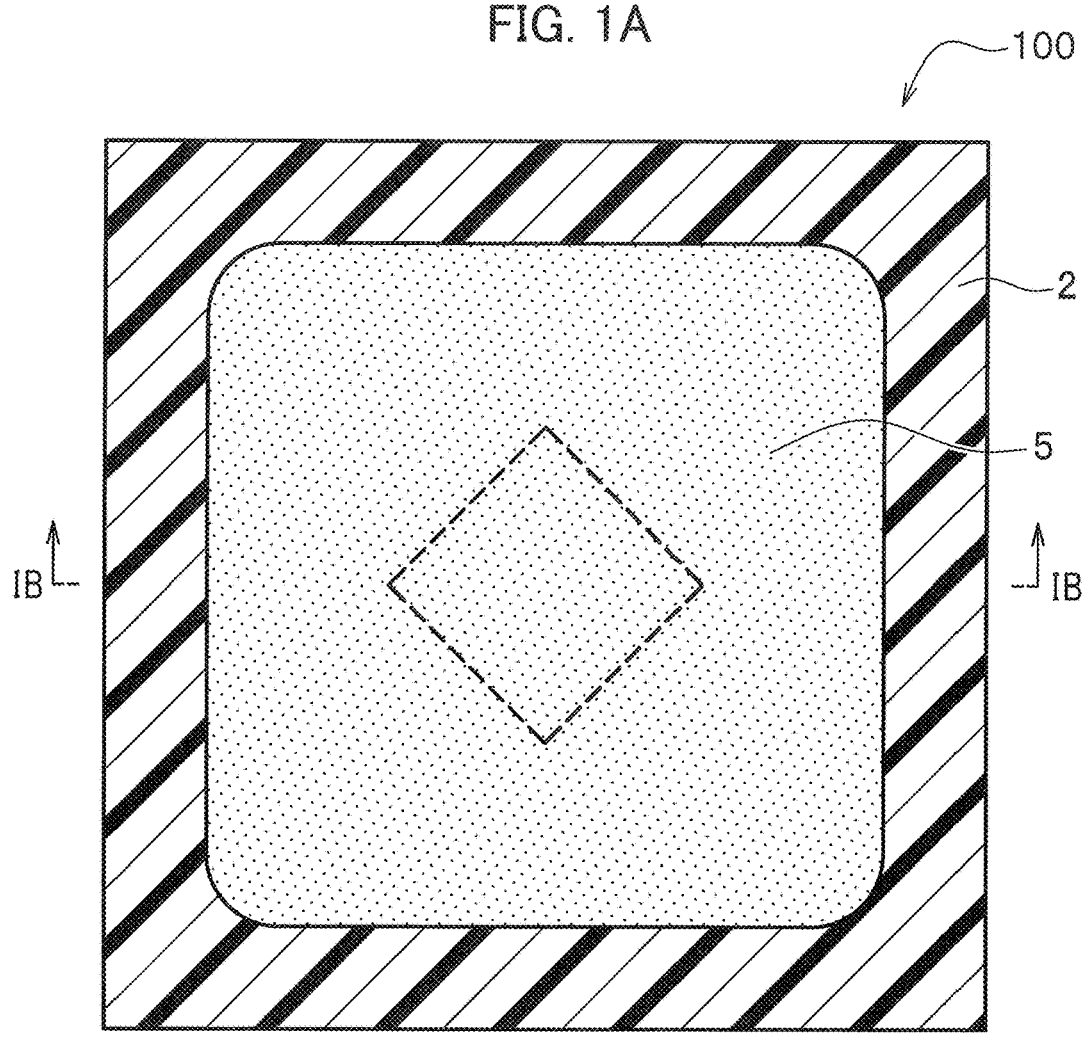
FIG. 1A is a plan view showing the structure of a light emitting device according to the present embodiment.

In the following, a description will be given of a method for manufacturing a light emitting element according to an embodiment. Note that, the drawings referred to in the following description schematically show the embodiment and, accordingly, the scale, interval, positional relationship of members may be exaggerated, or partly omitted. Further, a plan view and a cross-sectional view corresponding to the plan view may not coincide with each other in the scale or interval of members. Still further, in the following description, in principle, an identical name and a reference character refer to an identical or similar member, and a detailed description thereof will be omitted as appropriate. Further, in the present embodiment, the terms "upper", "lower" and the like refer relative positions between the constituent components, and not intended to refer an absolute position.

Structure of Light Emitting Device

Figure 1B:
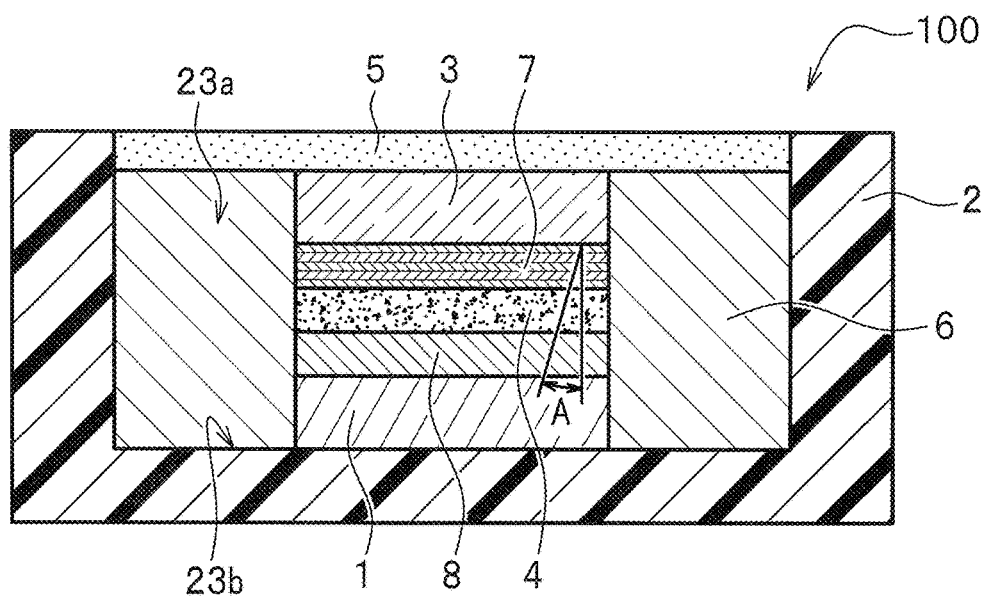
FIG. 1B is a cross-sectional view of the light emitting device according to the present embodiment taken along line IB-IB in FIG. 1A.

Firstly, with reference to FIGS. 1A and 1B, a description will be given of the structure of a light emitting device 100 according to the present embodiment. FIG. 1A is a plan view showing the structure of the light emitting device according to the present embodiment. FIG. 1B is a cross-sectional view showing the structure of the light emitting device according to the present embodiment taken along line IB-IB in FIG. 1A. Note that, hatching in FIG. 1A reflects the hatched members in the cross-sectional view of FIG. 1B. FIG. 1B shows an incident angle A. In the incident angle A, the direction perpendicular to a reflective film 7 is 0°.

The light emitting device 100 includes a light emitting element 1 emitting first light, a fluorescent material layer 4 disposed on the light emitting element 1 for being excited by the first light to emit second light being longer in wavelength than the first light, the reflective film 7 disposed on the fluorescent material layer 4 for reflecting the first light and transmitting the second light, a light-transmissive member 3 disposed on the reflective film 7, and an absorbing layer 5 disposed on the light-transmissive member 3 for absorbing the first light. The light emitting element 1 is disposed at a base member 2. The reflective member 6 is disposed at the base member 2 so as to be in contact with at least the fluorescent material layer 4 and the absorbing layer 5.

The light emitting element 1 is electrically connected to wirings disposed at a bottom surface 23b of a recess 23a at the base member 2, and emits the first light. The first light is blue-color light, and has the peak emission wavelength in a wavelength range of 420 nm to 480 nm inclusive. The blue-color light emitted from the light emitting element 1 has its wavelength converted by the fluorescent material layer 4, the absorbing layer 5 and the like, and extracted from the opening of the recess 23a as red-color light. The light emitting element 1 may be any known light emitting element. Preferably, the light emitting element 1 is a light emitting diode or a laser diode, for example. In particular, the light emitting element 1 emitting blue-color light is preferably ZnSe, a nitride-based semiconductor $In_xAl_yGa_{1-x-y}N$, $0 \leq X$, $0 \leq Y$, $X+Y \leq 1$ or the like. The light emitting element 1 is mounted on the bottom surface 23b of the recess 23a at the base member 2 by flip-chip bonding using a conductive bonding member such as solder, silver paste or the like. The mounted light emitting element 1 may be one or two or more in number.

The upper surface of the light emitting element 1 is disposed so as to oppose to the fluorescent material layer 4. The lower surface of the light emitting element 1 is disposed at the bottom surface 23b of the recess 23a at the base member 2. The lateral surface of the light emitting element 1 is disposed so as to be in contact with the reflective member 6. The light emitting element 1 may be identical in area to the light-transmissive member 3, the fluorescent material layer 4 and the like as seen in a plan view, or may be smaller in area than the light-transmissive member 3, the fluorescent material layer 4 and the like as seen in a plan view. By the light emitting element 1 being smaller in area than the light-transmissive member 3, the fluorescent material layer 4 and the like as seen in a plan view, a greater amount of the blue-color light emitted from the light emitting element 1 has its wavelength converted by the fluorescent material layer 4. Thus, the light emission efficiency of the light emitting device 100 improves. Note that, the light emitting element 1 may be polygonal such as quadrangular, rectangular, triangular, hexagonal and the like, or may be circular or oval as seen in a plan view.

Figure 2:
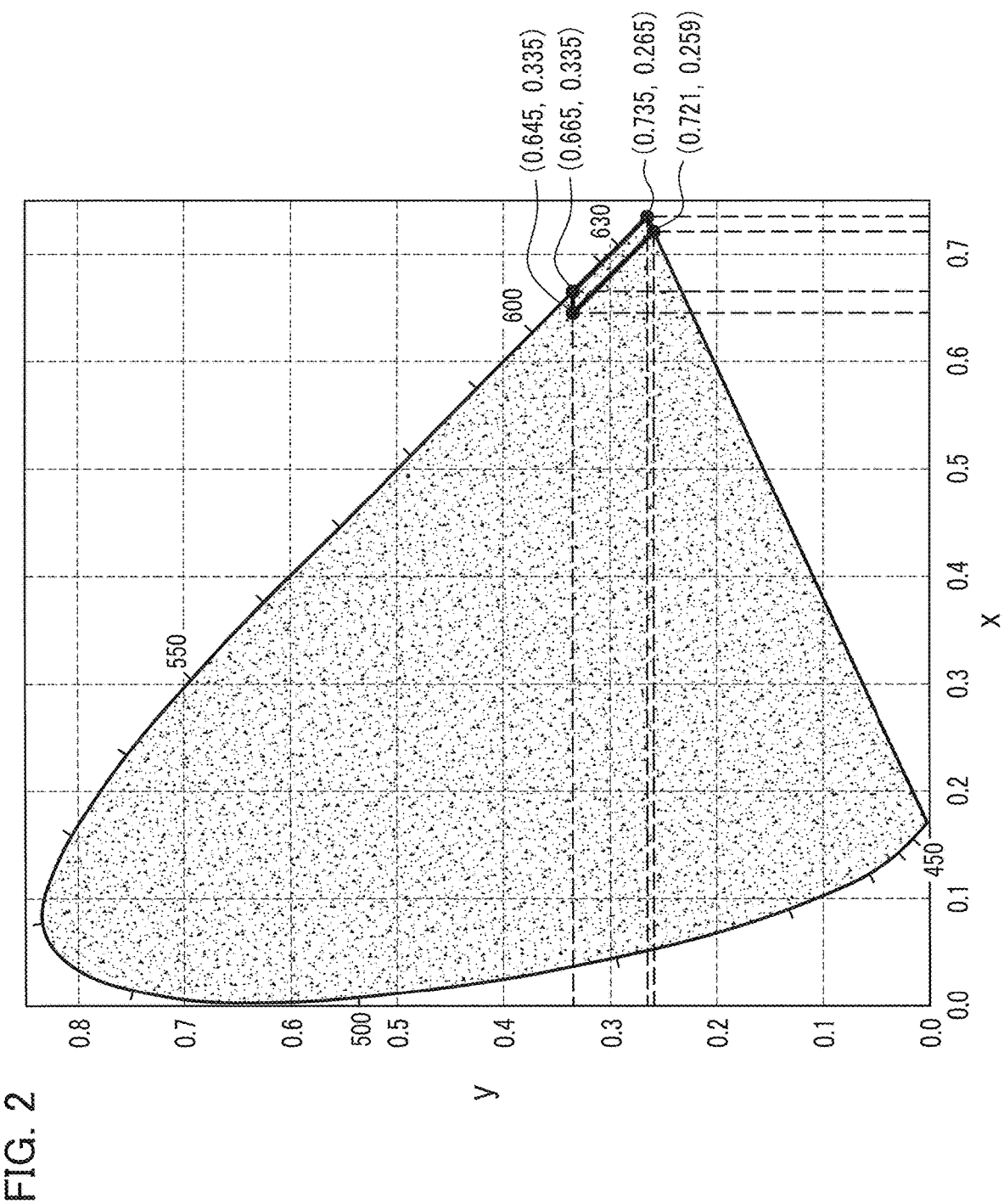
FIG. 2 is a graph showing an xy chromaticity coordinate system of the CIE1931 chromaticity diagram.

FIG. 2 is a graph showing the chromaticity coordinates of light emitted from the light emitting device 100 in the xy chromaticity coordinate system of the CIE1931 chromaticity diagram. The vertical axis indicates the y-coordinate, and the horizontal axis indicates the x-coordinate. Further, numerical values on the contour of the chromaticity diagram represent the wavelength [nm] of saturated colors.

The chromaticity coordinates of light emitted from the light emitting device 100 preferably exist in an area of a quadrangle formed by connecting four points in the CIE1931 chromaticity diagram, namely, the first point (x=0.645, y=0.335), the second point (x=0.665, y=0.335), the third point (x=0.735, y=0.265), and the fourth point (x=0.721, y=0.259). In the CIE1931 chromaticity diagram, the color appearing in the area defined by the quadrangle is red.

As described above, the blue-color light emitted from the light emitting element 1 has its wavelength converted by the fluorescent material layer 4, the absorbing layer 5 and the like, and extracted from the opening of the recess 23a to the outside as red-color light. Here, preferably, when the maximum intensity at the peak emission wavelength, e.g., a wavelength of 660 nm, of the light emitting device 100 is 1, the relative intensity at the peak emission wavelength, e.g., a wavelength of 450 nm, of the light emitting element 1 is 0.1 or less. As the relative intensity at the peak emission wavelength of the light emitting element 1 is smaller, the color purity of red-color light emitted from the light emitting device 100 increases.

The base member 2 includes the recess 23a. The outer shape and the inner shape being the inner side of the recess 23a are each substantially square as seen in a plan view. The base member 2 is formed by, for example, a material such as ceramic, thermosetting resin, thermoplastic resin or the like. Note that, the base member 2 may be flat plate-like dispensing with the recess 23a.

Note that, while the light emitting element 1 is disposed on the base member 2 herein, the light emitting device can dispense with the base member. Dispensing with the base member, the light emitting element can be disposed on a member exhibiting excellent thermal conductivity directly or via conductive member. Thus, heat from the light emitting element is efficiently transferred to the outside. Further, dispensing with the base member, the height of the light emitting device reduces.

Further, in the base member 2, preferably the uppermost surface of the recess 23a is at a position higher than the surface of the absorbing layer 5. Thus, red-color light having its wavelength converted by the absorbing layer 5 at the inner surface of the base member 2 is efficiently reflected and, therefore, the light emitting device 100 with high luminance is implemented.

The lower surface of the light-transmissive member 3 is disposed so as to oppose to the fluorescent material layer 4. The upper surface of the light-transmissive member 3 is disposed at the absorbing layer 5. The lateral surface of the light-transmissive member 3 is disposed so as to be in contact with the reflective member 6. Further, the light-transmissive member 3 is preferably formed by a material being highly light transmissive. The material may be, for example, a hardened or cured article of glass, ceramic, acrylic resin, silicone resin, epoxy resin or the like.

The fluorescent material layer 4 is excited by the first light, and emits the second light being longer in wavelength than the first light. The second light is red-color light, and has the peak emission wavelength in a wavelength range of 550 nm to 780 nm inclusive. As the amount of the first light emitted from the light emitting element 1 becoming incident on the fluorescent material layer 4 is greater, the fluorescent material layer 4 more efficiently excite the fluorescent material, so that the second light is emitted by a greater amount. Note that, the fluorescent material layer 4 may be formed by a mixture of the fluorescent material and a base material, or just by the fluorescent material.

The base material of the fluorescent material layer 4 is preferably highly light transmissive. The material may be, for example, silicone resin, epoxy resin, phenolic resin, polycarbonate resin, acrylic resin, fluororesin, modified resin of the foregoing, hybrid resin of the foregoing or the like. In particular, silicone resin exhibits excellent weather resistance, heat resistance, and light resistance and, therefore, preferably used as the base material of the fluorescent material layer 4.

The fluorescent material that the fluorescent material layer 4 contains is a material that absorbs at least part of the first light emitted from the light emitting element 1 and emits the second light. The material of the fluorescent material may be, for example, at least one selected from the group consisting of a $CaAlSiN_3$:Eu fluorescent material (a "CASN fluorescent material"), a $(Sr,Ca)AlSiN_3$:Eu fluorescent material (a "SCASN fluorescent material"), and a $K_2SiF_6$:Mn fluorescent material (a "KSF fluorescent material"), or a combination of the foregoing.

The absorbing layer 5 absorbs the first light, and emits or assumes the second light being longer in wavelength than the first light. The second light is red-color light, and has the peak emission wavelength in a wavelength range of 550 nm to 780 nm inclusive. The absorbing layer 5 absorbs, for example, the first light failed to be fully absorbed by the fluorescent material layer 4, the first light being great in incident angle relative to the reflective film 7 and the like. By the absorbing layer 5 being disposed at the upper surface of the recess 23a at the base member 2, the ratio of light converted from the first light to the second light increases. Thus, despite an increase in the ratio of blue-color light failing to be absorbed by the fluorescent material layer 4, or an increase in the ratio of blue-color light transmitting through the reflective film 7, the light emitting device 100 with reduced light leakage from the light emitting element 1 is implemented.

Figure 3:
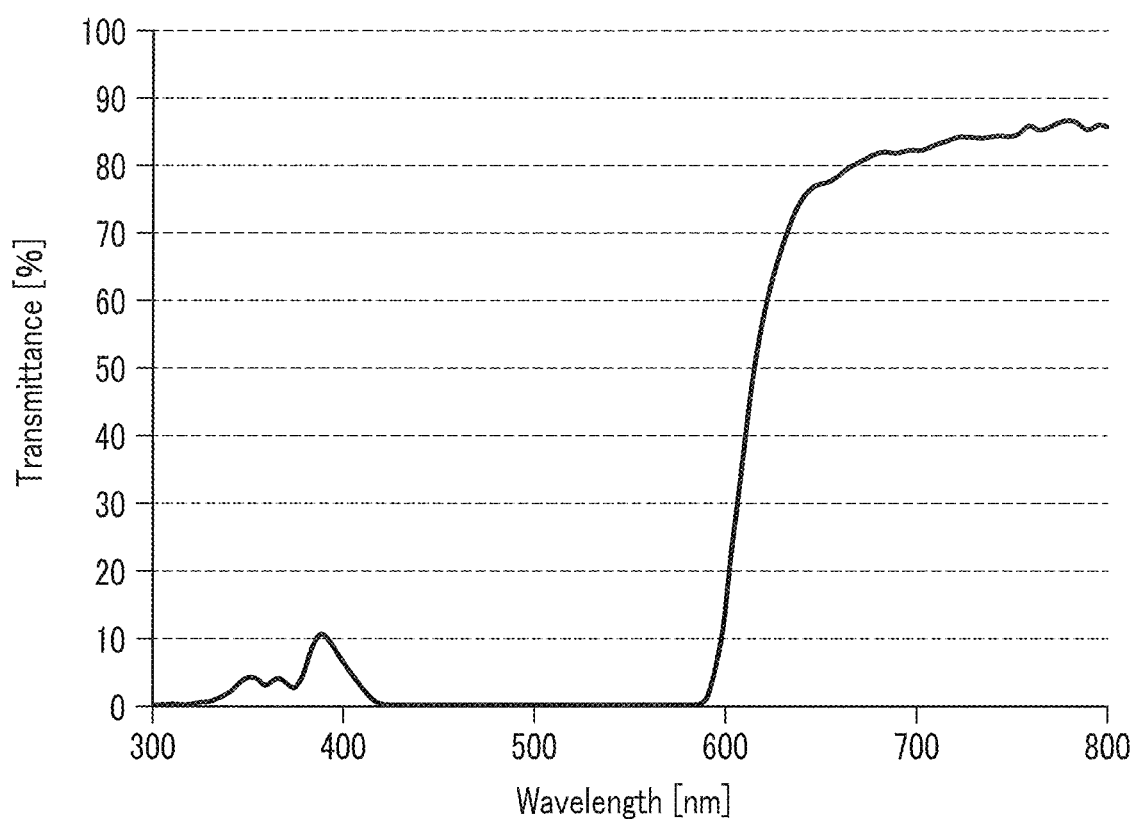
FIG. 3 is a graph showing the relationship between wavelengths and transmittance at an absorbing layer according to the present embodiment.

Here, with reference to FIG. 3, a description will be given of the transmittance of the absorbing layer 5. FIG. 3 is a graph showing the relationship between wavelengths and transmittance. The vertical axis indicates transmittance [%], and the horizontal axis indicates wavelengths [nm]. As shown in FIG. 3, the transmittance of the absorbing layer 5 for the light of which wavelength falls within a range of 420 nm to 480 nm inclusive is 10% or less, and the transmittance of the absorbing layer 5 for the light of which wavelength falls within a range of 630 nm to 800 nm inclusive is 70% or more. That is, the absorbing layer 5 preferably has the property of absorbing a greater amount of the first light and transmitting a greater amount of the second light. By the absorbing layer 5 having such a property being disposed at the upper surface of the recess 23a at the base member 2, the light emitting device 100 with reduced light leakage from the light emitting element 1 is implemented.

The absorbing layer 5 may be a fluorescent material layer, a pigment layer, or a dye layer. The fluorescent material contained in the fluorescent material layer may also be referred to as a second fluorescent material in the present specification. When the absorbing layer 5 is a fluorescent material layer, the second fluorescent material absorbs at least part of the first light and emits the second light. On the other hand, when the absorbing layer 5 is a pigment layer or a dye layer, the pigment or the dye absorbs at least part of the first light and assumes the second light. That is, the pigment or the dye itself does not emit light. The light that the fluorescent material layer, the pigment layer, or the dye layer emits or assumes is preferably light having the peak emission wavelength in a wavelength range of 550 nm to 780 nm inclusive. Note that, when the absorbing layer 5 contains the second fluorescent material, the concentration of the fluorescent material in the fluorescent material layer 4 is preferably higher than the concentration of the second fluorescent material in the absorbing layer 5.

The base material of the absorbing layer 5 is preferably a material being highly light transmissive. The material may be, for example, silicone resin, epoxy resin, phenolic resin, polycarbonate resin, acrylic resin, fluororesin, modified resin of the foregoing, hybrid resin of the foregoing or the like. In particular, silicone resin exhibits excellent weather resistance, heat resistance, and light resistance and, therefore, preferably used as the base material of the absorbing layer 5.

The material of the second fluorescent material contained in the absorbing layer 5 may be, for example, at least one selected from the group consisting of a CASN fluorescent material, a SCASN fluorescent material, and a KSF fluorescent material, or a combination of the foregoing.

The material of the pigment contained in the absorbing layer 5 is preferably a red-color material, and may be, for example, at least one selected from the group consisting of a perylene-based pigment, and titanium nickel antimony-based oxide, or a combination of the foregoing. The content of the pigment contained in the absorbing layer 5 preferably falls within a range of 0.05% to 0.5% inclusive relative to the base material of the absorbing layer 5.

The material of the dye contained in the absorbing layer 5 is preferably a red-color material, and may be, for example, at least one selected from the group consisting of an anthraquinone-based dye and a triphenylmethane-based basic dye, or a combination of the foregoing.

The reflective member 6 is disposed in the recess 23a so as to be in contact with at least the fluorescent material layer 4 and the absorbing layer 5. By the reflective member 6 being disposed in this manner, the amount of light propagating upward from the light emitting element 1 can be increased. In the drawings, the reflective member 6 is in contact with the lateral surface of the fluorescent material layer 4, the lower surface of the absorbing layer 5 and the like. When the base member 2 includes the recess 23a, the recess 23a is further preferably filled with the reflective member 6. By the reflective member 6 efficiently reflecting the second light that the fluorescent material layer 4 emits and the second light that the absorbing layer 5 emits or assumes, the light extraction efficiency of the light emitting device 100 improves.

The base material of the reflective member 6 is preferably a material being highly light transmissive and electrically insulating. The material may be, for example, silicone resin, silicone-modified resin, silicone-hybrid resin, epoxy resin, epoxy-modified resin, urea-formaldehyde resin, diallyl phthalate resin, phenolic resin, unsaturated polyester resin or the like.

The light-reflective substance contained in the reflective member 6 is preferably a material being greater in the difference in refractive index from the base material, and may be, for example, at least one selected from the group consisting of zirconium oxide, yttrium oxide, aluminum oxide, aluminum hydroxide, barium carbonate, barium sulfate, magnesium oxide, magnesium carbonate, titanium oxide, silicon dioxide, zirconium dioxide, potassium titanate, alumina, aluminum nitride, and boron nitride, or a combination of the foregoing. Note that, the average particle size of the light-reflective substance preferably falls within a range of 0.001 μm to 10 μm inclusive, more preferably a range of 0.01 μm to 0.05 μm inclusive. With the average particle size falling within this range, the light scattering effect and the light extraction efficiency of the light emitting device 100 improve.

The reflective film 7 is disposed between the light-transmissive member 3 and the fluorescent material layer 4, and efficiently causes blue-color light emitted from the light emitting element 1 to be incident on the fluorescent material layer 4 or the absorbing layer 5. That is, the reflective film 7 exhibits high reflectivity to the first light that the light emitting element 1 emits, and exhibits high transmittance to the second light that the fluorescent material layer 4 emits or the second light that the absorbing layer 5 emits or assumes.

Figure 4:
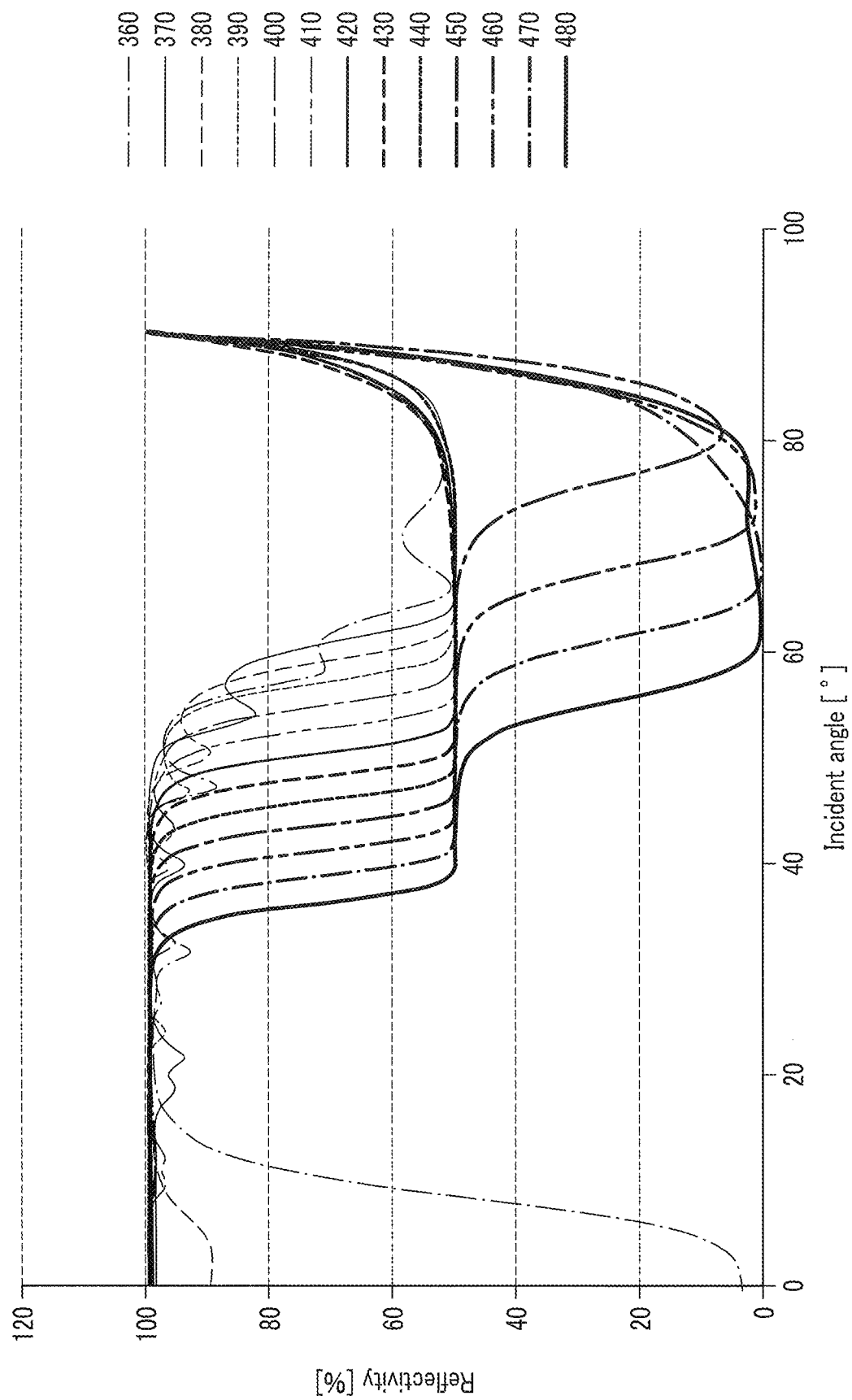
FIG. 4 is a graph showing the relationship between incident angles and reflectivity at a reflective film according to the present embodiment.
Figure 5:
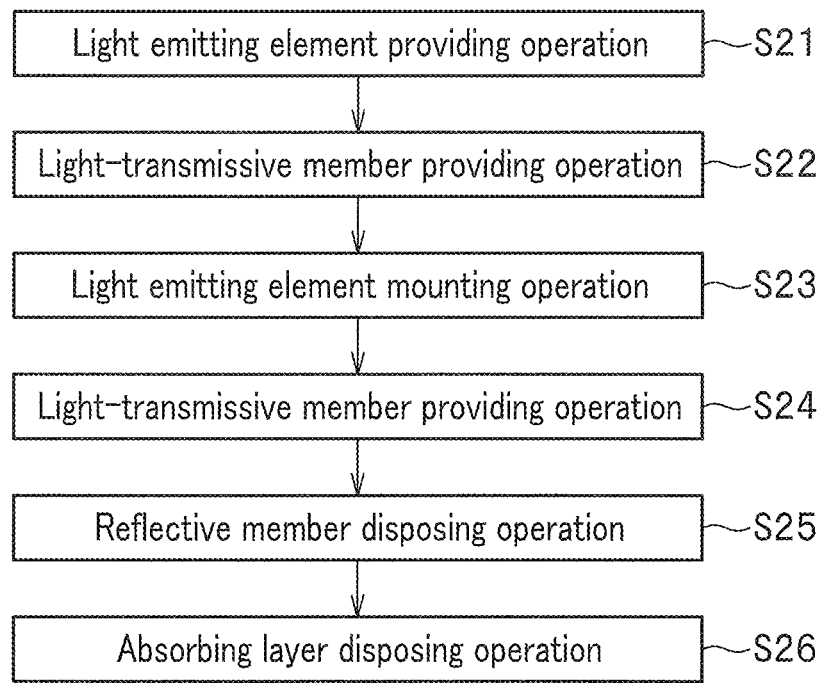
FIG. 5 is a flowchart showing the procedure of a method of manufacturing a light emitting device according to the present embodiment.

Here, with reference to FIG. 4, a description will be given of the reflectivity of the reflective film 7. FIG. 4 is a graph showing the relationship between incident angles and reflectivity. The vertical axis indicates reflectivity [%], and the horizontal axis indicates incident angles [°]. When the incident angle of the first light falls within a range of 0° to 30° inclusive, the reflective film 7 preferably exhibits a reflectivity of 90% or more for the first light. Further, when the incident angle of the first light is 0°, the reflective film 7 preferably exhibits a reflectivity of 90% or more for the light having the peak emission wavelength in a wavelength range of 380 nm to 530 nm inclusive. That is, the reflective film 7 is preferably higher in reflectivity for the first light. Further, the reflective film 7 preferably is capable of maintaining high reflectivity for the first light despite an increased incident angle range.

The reflective film 7 is a dielectric multilayer film formed by at least two types of dielectric layers being alternately layered. The material of the dielectric layer may be, for example, $SiO_2$, $Nb_2O_5$ or the like. Note that, the number of layers in the dielectric layer is not particularly specified.

The bonding member 8 bonds the light emitting element 1 and the fluorescent material layer 4 to each other. The bonding member 8 is preferably formed by a material being identical to the base material of the fluorescent material layer 4. This reduces the difference in refractive index between the fluorescent material layer 4 and the bonding member 8 and, therefore, a greater amount of blue-color light emitted from the light emitting element 1 is caused to become incident on the fluorescent material layer 4. Further, the bonding member 8 is preferably formed by a material being highly light transmissive. The material may be, for example, silicone resin, epoxy resin, acrylic resin, polyimide resin or the like. Note that, the light emitting element 1 and the fluorescent material layer 4 may be bonded to each other via the bonding member 8 or directly bonded to each other dispensing with the bonding member 8.

As described above, in the light emitting device 100 according to the present embodiment, the absorbing layer 5 is disposed at the upper surface of the recess 23a at the base member 2. Without the absorbing layer 5, the light emitted from the light emitting element 1 leaks to the outside from around the interface between the lateral surface of the light-transmissive member 3 and the reflective member 6. Addressing thereto, providing the absorbing layer 5 at the upper surface of the recess 23a at the base member 2 prevents light emitted from the light emitting element 1 from leaking to the outside. This implements the light emitting device 100 with reduced light leakage from the light emitting element 1 as seen in the diagonal direction, which light emitting device 100 being capable of uniformly displaying red color irrespective of the observing direction.

Operation of Light Emitting Device

Next, with reference to FIGS. 1A and 1B, a description will be given of an operation of the light emitting device 100 according to the present embodiment.

In the light emitting device 100, the light emitting element 1 emits blue-color light, the fluorescent material layer 4 absorbs the blue-color light and emits red-color light, and the absorbing layer 5 absorbs the blue-color light and emits or assumes red-color light.

When current is supplied from an external power supply across a pair of electrodes provided at the light emitting element 1 via wirings disposed at the bottom surface 23b of the recess 23a at the base member 2, the light emitting element 1 emits blue-color light.

Part of the blue-color light emitted from the light emitting element 1 becomes incident on the fluorescent material layer 4 via the upper surface of the light emitting element 1. The blue-color light absorbed by the fluorescent material layer 4 has its wavelength converted, and extracted to the outside as red-color light from the opening of the recess 23a. The blue-color light failed to be absorbed by the fluorescent material layer 4 and the blue-color light transmitted through the reflective film 7 become incident on the absorbing layer 5, and absorbed by the absorbing layer 5. Further, part of the blue-color light emitted from the light emitting element 1 propagates from the lateral surface of the light emitting element 1 inside the reflective member 6 and reflected upward, then becomes incident on the absorbing layer 5 and absorbed by the absorbing layer 5. Note that, in some cases, the blue-color light propagating inside the reflective member 6 is reflected by the reflective member 6 and again passes through the light emitting element 1.

The light emitting device 100 not only causes blue-color light to be absorbed by the fluorescent material layer 4, but also causes every blue-color light, including blue-color light failed to be fully absorbed by the fluorescent material layer 4, blue-color light with a great incident angle (0° to 90°) relative to the reflective film 7, and blue-color light failed to become incident on the fluorescent material layer 4, to be absorbed by the absorbing layer 5.

As a result, as compared to a light emitting device including no absorbing layer 5, the light emitting device 100 can increase the ratio of light converted from blue-color light to red-color light. That is, the light emitting device 100 efficiently converts the wavelength of blue-color light with the absorbing layer 5 disposed at the upper surface of the recess 23a which is in the direction along which the light is extracted, thereby emitting red-color light of high color purity.

Method of Manufacturing Light Emitting Device

Next, with reference to FIGS. 5 to 7C, a description will be given of a method of manufacturing a light emitting device according to the present embodiment. Note that, the order of part of operations is not specified, and is interchangeable.

The method of manufacturing a light emitting device according to the present embodiment includes: a light emitting element providing operation (S21); a light-transmissive member providing operation (S22); a light emitting element mounting operation (S23); a light-transmissive member disposing operation (S24); a reflective member disposing operation (S25); and an absorbing layer disposing operation (S26). Hereinafter, the method will be specifically described.

Figure 6A:
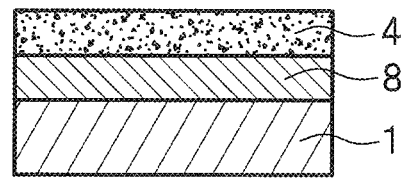
FIG. 6A is a cross-sectional view showing a light emitting element providing operation in the method of manufacturing a light emitting device according to the present embodiment.

As shown in FIG. 6A, the light emitting element providing operation (S21) is an operation of providing the light emitting element 1. In the light emitting element providing operation (S21), at the upper surface of the light emitting element 1, the fluorescent material layer 4 is formed via the bonding member 8. At the lower surface of the light emitting element 1, a pair of electrodes is formed. Note that, the fluorescent material layer 4 may be directly bonded to the upper surface of the light emitting element 1 dispensing with the bonding member 8.

Figure 6B:
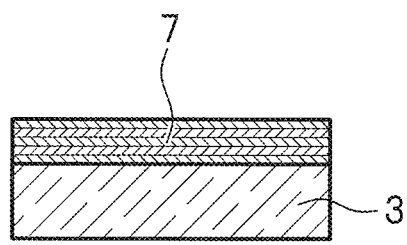
FIG. 6B is a cross-sectional view showing a light-transmissive member providing operation in the method of manufacturing a light emitting device according to the present embodiment.

As shown in FIG. 6B, the light-transmissive member providing operation (S22) is an operation of providing the light-transmissive member 3. In the light-transmissive member providing operation (S22), at the upper surface of the light-transmissive member 3, the reflective film 7 is formed. The reflective film 7 is formed by at least two types of dielectric layers being deposited by sputtering or the like at the upper surface of the light-transmissive member 3.

Figure 6C:
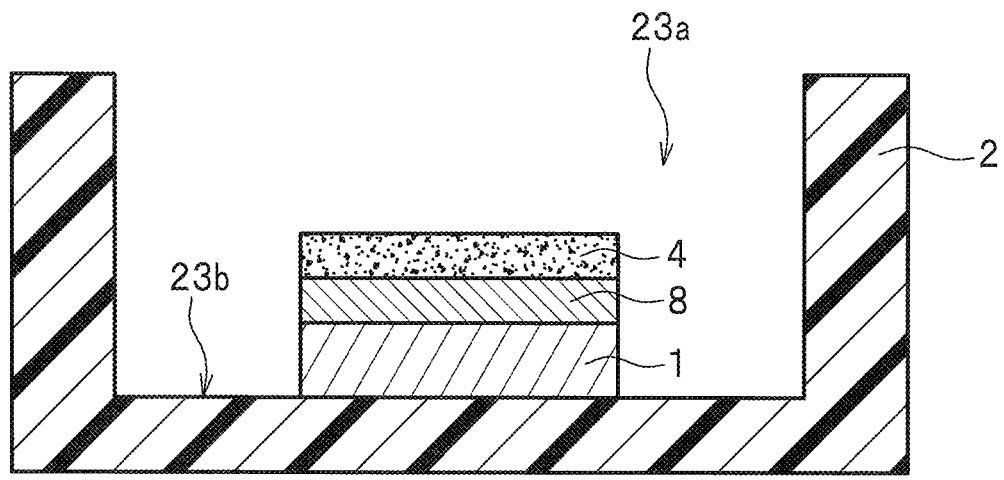
FIG. 6C is a cross-sectional view showing a light emitting element mounting operation in the method of manufacturing a light emitting device according to the present embodiment.

As shown in FIG. 6C, the light emitting element mounting operation (S23) is an operation of mounting the light emitting element on the base member 2. In the light emitting element mounting operation (S23), the light emitting element 1 is mounted on the bottom surface 23b of the base member 2 having the recess 23a, via a pair of electrodes formed at the lower surface of the light emitting element 1. The light emitting element 1 is electrically connected to wirings disposed so as to expose at the bottom surface 23b. The method of mounting the light emitting element 1 is preferably the flip-chip mounting by reflow soldering.

Figure 7A:
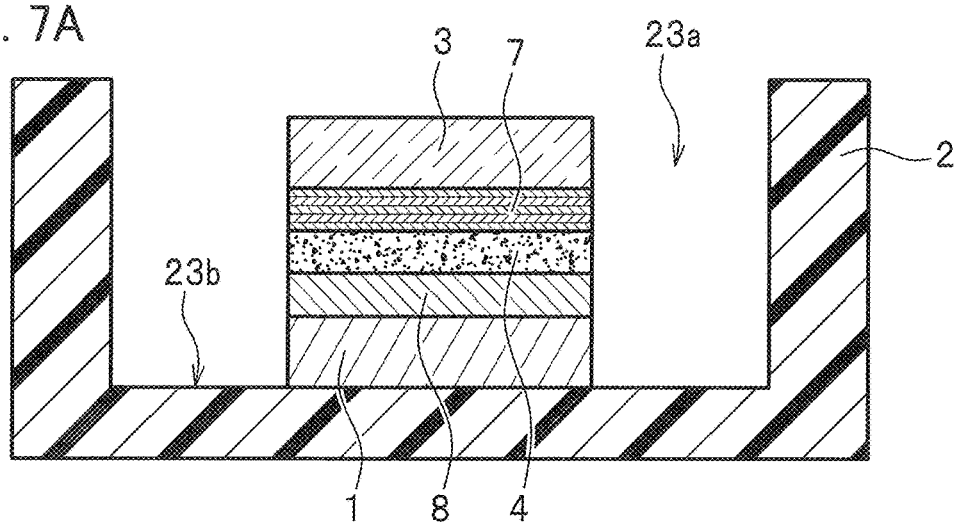
FIG. 7A is a cross-sectional view showing a light-transmissive member disposing operation in the method of manufacturing a light emitting device according to the present embodiment.

As shown in FIG. 7A, the light-transmissive member disposing operation (S24) is an operation of disposing the light-transmissive member. In the light-transmissive member disposing operation (S24), the light-transmissive member 3 is disposed on the light emitting element 1 so that the reflective film 7 and the fluorescent material layer 4 are in contact with each other.

Figure 7B:
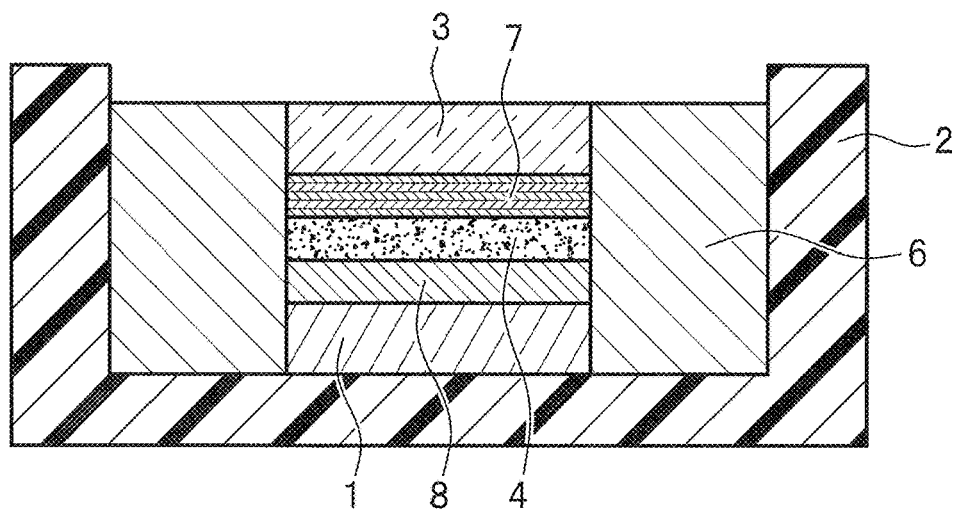
FIG. 7B is a cross-sectional view showing a reflective member disposing operation in the method of manufacturing a light emitting device according to the present embodiment.

As shown in FIG. 7B, the reflective member disposing operation (S25) is an operation of providing the reflective member 6 at the recess 23a so as to cover the lateral surface of each of the light emitting element 1 and the fluorescent material layer 4. In the reflective member disposing operation (S25), the reflective member 6 is formed by, after filling the recess 23a with uncured resin in which a light-reflective substance is dispersed by potting using a dispenser of the like, heating the resin at a predetermined temperature for a predetermined time using a heating apparatus such as a heater or a reflow oven. Note that, the reflective member 6 is not formed on the light-transmissive member 3.

When the base member 2 does not have the recess 23a and is flat plate-like, the reflective member 6 is formed by, after filling the space formed by a frame body disposed so as to encircle the light emitting element 1 with uncured resin in which a light-reflective substance is dispersed, heating the resin at a predetermined temperature for a predetermined time and thereafter removing the frame body.

Figure 7C:
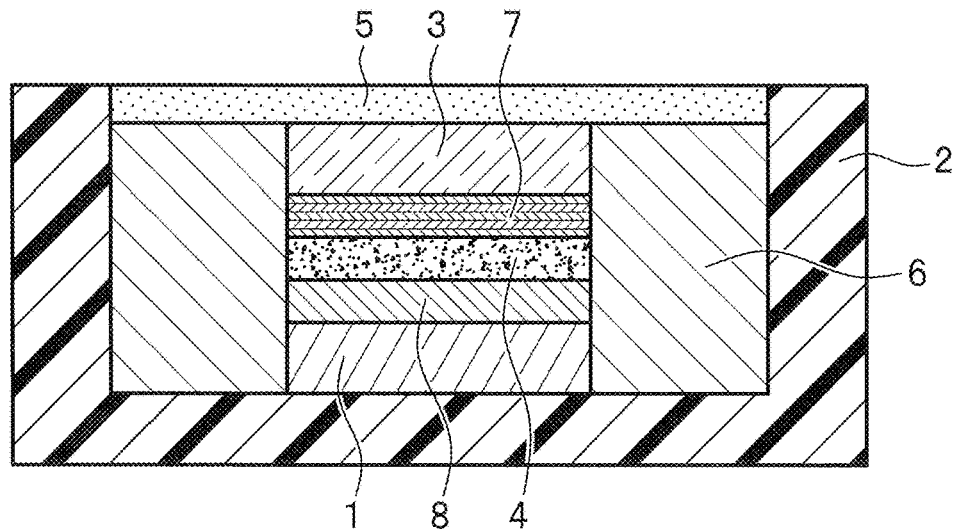
FIG. 7C is a cross-sectional view showing an absorbing layer disposing operation in the method of manufacturing a light emitting device according to the present embodiment.

As shown in FIG. 7C, the absorbing layer disposing operation (S26) is an operation of disposing the absorbing layer 5 so as to cover the light-transmissive member 3 and the reflective member 6. In the absorbing layer disposing operation (S26), the absorbing layer 5 is formed by, after dripping uncured resin in which a second fluorescent material, pigment, or dye is dispersed on the light-transmissive member 3 and the reflective member 6 by potting using a dispenser or the like, heating the resin at a predetermined temperature for a predetermined time using a heating apparatus such as a heater or a reflow oven. Note that, when the absorbing layer 5 is made of a fluorescent material such as a KSF fluorescent material which is brittle, any scheme that applies shock to the fluorescent material such as spraying or any scheme that applies pressure to the fluorescent material such as screen printing may damage the fluorescent material. Accordingly, in this case, particularly potting should be preferably employed, which relatively causes smaller damage to the fluorescent material.

The method of manufacturing a light emitting device may further include an operation of separating the base member 2 from the light emitting element 1. This provides a light emitting device reduced in thickness. Further, the light emitting element 1 can be disposed on a member exhibiting high thermal conductivity dispensing with the base member 2 and, hence, heat from the light emitting element 1 is efficiently dissipated. In the case where the light emitting element is separated from the base member, the base member may be any sheet or flat plate.

As described above, performing the above-described operations, the light emitting device 100 is manufactured. Note that, the operations is not necessarily performed in the above-described order. For example, after the light-transmissive member providing operation (S22) is performed, the light emitting element providing operation (S21) may be performed.

Here, a description will be given of a method of manufacturing a light emitting device which is different from the method of manufacturing a light emitting device described above with reference to FIGS. 5 to 7C. The members used herein may be the same as those used for the above-described light emitting device and the method of manufacturing the same.

Firstly, a light-transmissive member in which a reflective film is formed on a light-transmissive member, and a fluorescent material layer is formed on the reflective film is provided. For example, on a flat plate-like light-transmissive member, a dielectric multilayer film made up of $SiO_2$ and $Nb_2O_5$ being different from each other in refractive index is formed. On the reflective film, resin containing a fluorescent material is applied by any known method such as spraying, potting, or screen printing, to form a fluorescent material layer having a predetermined thickness.

Next, a light emitting element provided with electrodes at its lower surface is provided. Further, a base member is provided. The base member preferably includes a recess. At the inner bottom surface of the recess, a wiring layer to serve as a pair of electrodes is formed. On the wiring layer at the inner bottom surface of the recess, the light emitting element is mounted via the electrodes.

Next, the light-transmissive member is disposed on the light emitting element so that the fluorescent material layer and the upper surface of the light emitting element are in contact with each other. This light-transmissive member may be a singulated one, or may be cleaved after the light-transmissive member is mounted on the light emitting element. On the inner bottom surface of the recess, the light emitting element is mounted. The light emitting element is spaced apart from the inner surface of the recess by a predetermined distance. The reflective member is disposed inside the recess and at the lateral surface of each of the light emitting element and the light-transmissive member. The reflective member can be formed by any known method such as spraying, dripping, printing and the like. For example, by applying a mask or the like to the surface of the light-transmissive member, spraying, dripping, or printing the reflective member, and thereafter removing the mask, a predetermined position corresponding to the position to emit light is exposed outside the reflective member. By the reflective member being disposed at the lateral surface of the light emitting element or at the lateral surface of the light-transmissive member, light laterally emitted from the light emitting element can be efficiently extracted upward.

Next, on the light-transmissive member, an absorbing layer that absorbs light emitted from the light emitting element is disposed. The absorbing layer may cover the upper surface of the reflective member. Alternatively, the absorbing layer may cover the upper surface of the recess at the base member.

In this manner, the light emitting device according to the present embodiment can be manufactured. By virtue of the reflective film and the fluorescent material layer being formed at the light-transmissive member in this manner, easier manufacture is realized.

EXAMPLES 1 to 8

The light emitting devices 100 were fabricated according to the method of manufacturing a light emitting device according to the present embodiment. Example 1 is the light emitting device 100 including the absorbing layer 5 of which pigment concentration is 0.025%. Example 2 is the light emitting device 100 including the absorbing layer 5 of which pigment concentration is 0.050%. Example 3 is the light emitting device 100 including absorbing layer 5 of which pigment concentration is 0.075%. Example 4 is the light emitting device 100 including the absorbing layer 5 of which pigment concentration is 0.100%. Example 5 is the light emitting device 100 including the absorbing layer 5 of which pigment concentration is 0.225%. Example 6 is the light emitting device 100 including the absorbing layer 5 of which pigment concentration is 0.350%. Example 7 is the light emitting device 100 including the absorbing layer 5 of which pigment concentration is 0.500%. Example 8 is the light emitting device 100 including the absorbing layer 5 of which pigment concentration is 1.000%. The constituent components (the light emitting element 1, the base member 2, the light-transmissive member 3, the fluorescent material layer 4, the reflective member 6, the reflective film 7, and the bonding member 8) other than the absorbing layer 5 are common among Examples 1 to 8.

Details of the constituent components in Examples 1 to 8 are shown below.

Light Emitting Element 1
Number of pieces: mounted one in number
Type: a blue-color LED of which peak emission wavelength is at about 445 nm
Outer dimension as seen in a plan view: a square each side (length or width) measuring 800 μm
Height: 150 μm
Base Member 2
Material: ceramic
Outer dimension as seen in a plan view: a square each side (length or width) measuring 3.0 mm
Inner dimension as seen in a plan view: a square each side (length or width) measuring 2.3 mm
Light-Transmissive Member 3
Material: glass
Outer dimension as seen in a plan view: a square each side (length or width) measuring 1.15 mm
Shape: flat plate-like
Thickness: 150 μm
Fluorescent Material Layer 4
Base material: dimethyl silicone resin (product name KJR-9201 "Shin-Etsu Chemical Co., Ltd.", content 32.5 mass %)
Fluorescent material: CASN (model number 381-90, peak emission wavelength 650 nm, great particle size, content 67.5 mass %)
Outer dimension as seen in a plan view: a square each side (length or width) measuring 1.15 mm
Thickness: 104 μm
Absorbing Layer 5
Base material: dimethyl silicone resin (product name KJR-9150 "Shin-Etsu Chemical Co., Ltd.", content 99.0 mass % to 100.0 mass %)
Pigment: perylene-based pigment (product name NER105)
Outer dimension as seen in a plan view: a square each side (length or width) measuring 2.3 mm
Thickness: 200 μm
Reflective Member 6
Base material: silicone resin (content 62.5 mass %)
Light-reflective substance: titanium oxide (particle size 0.5 μm, content 37.5 mass %)
Heating temperature: about 150° C.
Heating time: about 4 hours
Reflective Film 7
Material: $SiO_2$, $Nb_2O_5$
Outer dimension as seen in a plan view: a square each side (length or width) measuring 1.15 mm
Whole thickness: 2 μnm
Bonding Member 8
Material: silicone resin
Outer dimension as seen in a plan view: a square each side (length or width) measuring 1.15 mm
Thickness: 10 μm

COMPARATIVE EXAMPLE 1

In order to compare against the light emitting devices of Examples, a light emitting device of Comparative Example was fabricated. Comparative Example 1 is the light emitting device 100 including the absorbing layer 5 of which pigment concentration is 0%. The constituent components (the light emitting element 1, the base member 2, the light-transmissive member 3, the fluorescent material layer 4, the reflective member 6, the reflective film 7, and the bonding member 8) are common among Comparative Example 1 and Examples 1 to 8. Details of the constituent components in Comparative Example 1 are as described above.

Evaluation of Examples 1 to 8 and Comparative Example 1

The light emitting devices of Examples 1 to 8 and the light emitting device of Comparative Example 1 were evaluated. The evaluation result is shown below.

FIG. 8 is a graph showing the relationship between directivity angles and light distribution chromaticity in relation to Examples 1 to 8 and Comparative Example 1. The vertical axis indicates light distribution chromaticity Δx (a displacement amount on the xy chromaticity diagram), and the horizontal axis indicates directivity angles [°].

As shown in FIG. 8, in relation to Examples 1 to 8 and Comparative Example 1, the absolute value of the light distribution chromaticity became greater as the directivity angle was greater. Further, the absolute value of the light distribution chromaticity was greatest with Comparative Example 1. Further, in Example 7, the absolute value of the light distribution chromaticity inverted from negative to positive around the point where the directivity angle was ±40°. Further, the absolute value of the light distribution chromaticity in Example 4 was about half as great as the absolute value of the light distribution chromaticity in Comparative Example 1.

Accordingly, it was found that the chromaticity deviation of the light emitting devices tended to improve as the pigment concentration of the absorbing layer 5 was greater; on the other hand, an excessively great pigment concentration of the absorbing layer 5 invited aggravation. Further, it was found that the chromaticity deviation of the light emitting devices improved most when the pigment concentration of the absorbing layer 5 was 0.350%.

Figure 9:
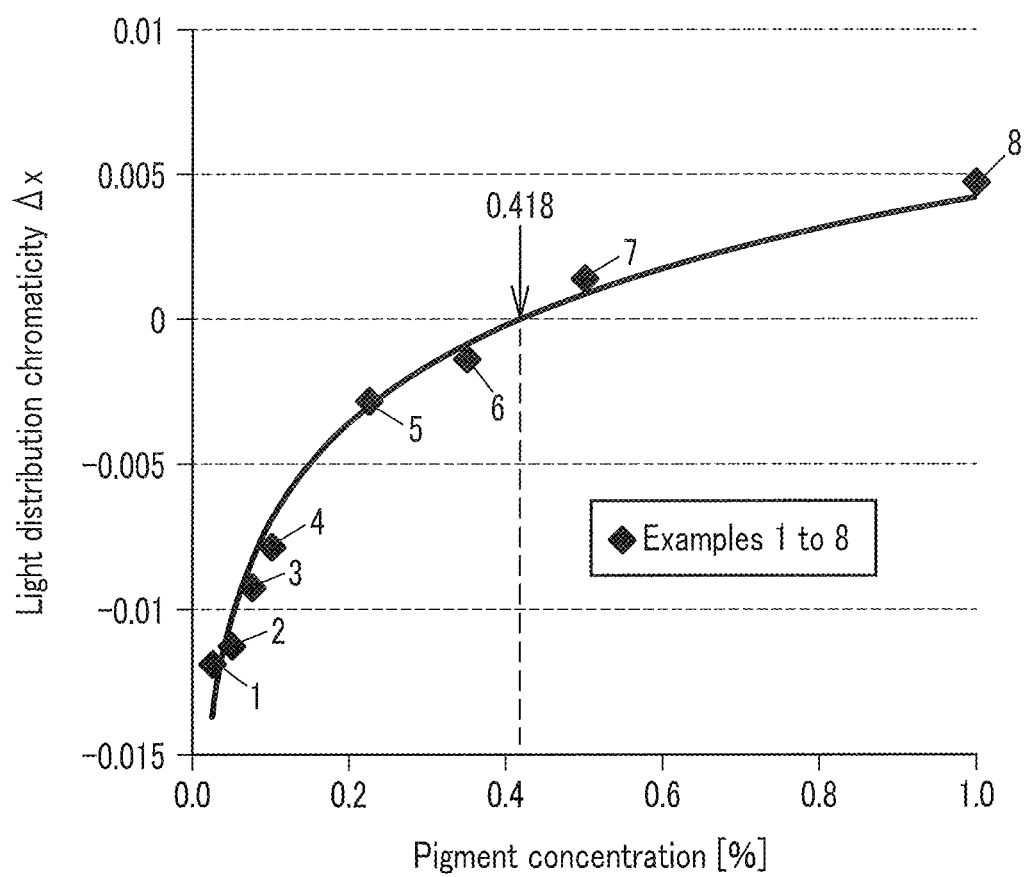
FIG. 9 is a graph showing the relationship between pigment concentrations and light distribution chromaticity in relation to Examples 1 to 8.

FIG. 9 is a graph showing the relationship between pigment concentrations and light distribution chromaticity in relation to Examples 1 to 8. The vertical axis indicates light distribution chromaticity Δx (a displacement amount on the xy chromaticity diagram), and the horizontal axis indicates pigment concentrations [%]. Each rhombus represents a light distribution chromaticity corresponding to a pigment concentration in Examples, and each curve represents an approximated curve of the light distribution chromaticity corresponding to each Example. Note that, the light distribution chromaticity Δx shown in FIG. 9 is obtained at ±80°.

As shown in FIG. 9, the absolute value of the light distribution chromaticity was greatest with Example 1. Further, the absolute value of the light distribution chromaticity became smaller as the pigment concentration was greater up to a pigment concentration of 0.418%; on the other hand, the absolute value of the light distribution chromaticity became greater as the pigment concentration was greater with a pigment concentration greater than 0.418%.

Accordingly, it was found that the chromaticity deviation of the light emitting device tended to improve as the pigment concentration of the absorbing layer 5 was greater: on the other hand, an excessively great pigment concentration of the absorbing layer 5 invited aggravation. Further, it was found that the chromaticity deviation of the light emitting device improved most when the pigment concentration of the absorbing layer 5 was 0.418%. That is, from the result shown in FIGS. 8 and 9, the pigment concentration of the absorbing layer 5 preferably falls within a range of 0.05% to 0.50% inclusive.

Table 1 is a table showing the measurement result of half-power angles [°] in relation to Example 2, Example 4, Example 7, Example 8, and Comparative Example 1. A half-power angle is the angle representing deviation from the front in the case where the light intensity is 0.5 when the light emitting device is viewed as being displaced from the front while the light intensity is 1 when the light emitting device is viewed from the front. As the half-power angle is greater, the color of light emitted from the light emitting device appears to be pale; as the half-power angle is smaller, the color of light emitted from the light emitting device appears to be vivid.

TABLE 1

| Sample name | Pigment concentration [%] | Half-power angle [°] |
| --- | --- | --- |
| Example 2 | 0.05 | 114.8 |
| Example 4 | 0.10 | 114.5 |
| Example 7 | 0.50 | 113.0 |
| Example 8 | 1.00 | 110.9 |
| Comparative example 1 | 0.00 | 115.8 |

As shown in Table 1, the half-power angle was smallest with Example 8, and greatest with Comparative Example 1. A difference of 4.9 [°] in half-power angle was observed between Comparative Example 1 and Example 8.

FIG. 10 is a graph showing the relationship between directivity angles and light intensity in relation to Example 2, Example 4, Example 7, Example 8, and Comparative Example 1. The vertical axis indicates the light intensity Intensity [a.u. (arbitrary unit)], and the horizontal axis indicates directivity angles [°]. In FIG. 10, the broken line represents Example 2, the narrow line represents Example 4, the bold dashed line represents Example 7, the bold line represents Example 8, and the narrow dashed line represents Comparative Example 1.

As shown in FIG. 10, the light intensity became weaker as the directivity angle became greater in Example 2, Example 4, Example 7, Example 8, and Comparative Example 1. Further, the light intensity was weakest with Example 8 and greatest with Comparative Example 1. On the other hand, not much difference was observed as to the light intensity between Example 8 and Comparative Example 1.

From Table 1 and FIG. 10, it was found that, as the pigment concentration of the absorbing layer 5 was greater, the light leakage from the light emitting element 1 in the diagonal direction reduced and, therefore, the half-power angle tended to be narrow. That is, it was found that the color purity of red-color light emitted from the light emitting device 100 enhanced as the pigment concentration of the absorbing layer 5 was greater. Further, it was found that the light intensity of the light emitting device 100 did not much weaken with an increased pigment concentration of the absorbing layer 5. Accordingly, it was found that, by disposing the absorbing layer 5 at the upper surface of the recess 23a of the base member 2, and adjusting the pigment concentration of the absorbing layer 5 as appropriate, the light intensity of the light emitting device 100 could be substantially maintained while reducing light leakage from the light emitting element 1.

Figure 11A:
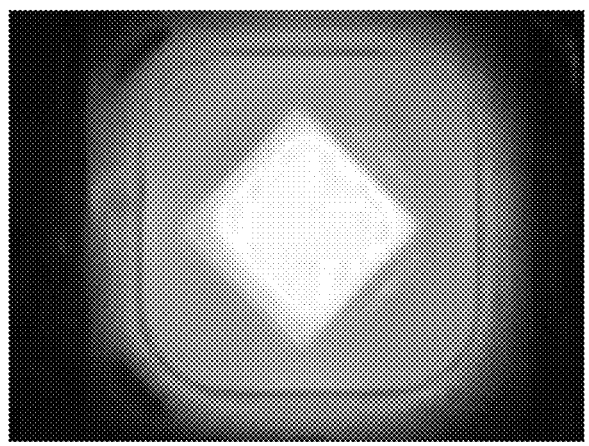
FIG. 11A shows the appearance of a light emitting device in a light up mode according to Example 4.
Figure 11B:
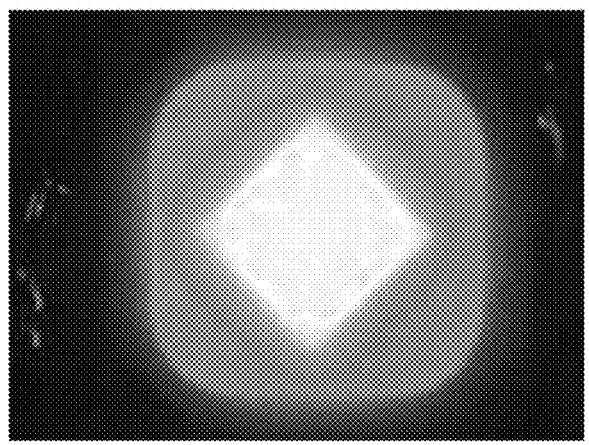
FIG. 11B shows the appearance of a light emitting device in a light up mode according to Example 7.
Figure 11C:
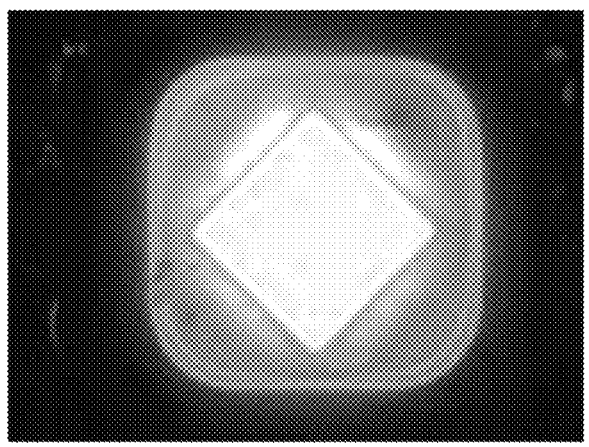
FIG. 11C shows the appearance of a light emitting device in a light up mode according to Comparative Example 1.

FIGS. 11A to 11C show the appearance of the light emitting devices of Example 4, Example 7, and Comparative Example 1 in a light up mode, being lit up with a drive current of 10 mA.

As shown in FIG. 11A, it was found that, with Example 4, light leakage of blue-color light from the lateral surface of glass (the light-transmissive member 3) was small. Further, it was found that, with Example 4, the glass looked whitish. This may be attributed to the presence of the pigment scattering blue-color light, which scattered light was reflected by the reflective film 7 and appeared whitish.

As shown in FIG. 11B, it was found that, with Example 7, light leakage of blue-color light from the lateral surface of glass was small. Further, it was found that, with Example 7, there existed little luminance unevenness between the center of the glass and the lateral surface of the glass.

As shown in FIG. 11C, it was found that, with Comparative Example 1, light leakage of blue-color light from the lateral surface of the glass was considerably great. Further, it was found that, with Comparative Example 1, because of leaked blue-color light being reflected by the reflective member, the surrounding of the light emitting element appeared to emit purple-color light in a color image.

Accordingly, it was found that, by disposing the absorbing layer 5 at the upper surface of the recess 23a of the base member 2, light leakage of the blue-color light of the light emitting device reduced. Further, it was found that, as the pigment concentration in the absorbing layer 5 was greater, the chromaticity deviation in the light emitting device 100 was smaller.

EXAMPLES 9 to 16

The light emitting devices 100 were fabricated according to the method of manufacturing a light emitting device according to the present embodiment. Example 9 is the light emitting device 100 including the absorbing layer 5 of which pigment concentration is 0.025%. Example 10 is the light emitting device 100 including the absorbing layer 5 of which pigment concentration is 0.050%. Example 11 is the light emitting device 100 including the absorbing layer 5 of which pigment concentration is 0.075%. Example 12 is the light emitting device 100 including the absorbing layer 5 of which pigment concentration is 0.100%. Example 13 is the light emitting device 100 including the absorbing layer 5 of which pigment concentration is 0.225% Example 14 is the light emitting device 100 including the absorbing layer 5 of which pigment concentration is 0.350%. Example 15 is the light emitting device 100 including the absorbing layer 5 of which pigment concentration is 0.500%. Example 16 is the light emitting device 100 including the absorbing layer 5 of which pigment concentration is 1.000%. The constituent components (the light emitting element 1, the base member 2, the light-transmissive member 3, the fluorescent material layer 4, the reflective member 6, the reflective film 7, and the bonding member 8) other than the absorbing layer 5 are common among Examples 9 to 16.

Further, the constituent components (the light emitting element 1, the base member 2, the light-transmissive member 3, the reflective member 6, and the bonding member 8) other than the fluorescent material layer 4 and the reflective film 7 are common among Examples 9 to 16 and Examples 1 to 8. Details of the constituent components in the fluorescent material layer 4 and the reflective film 7 are shown below.

Fluorescent material layer 4

Base material: dimethyl silicone resin (product name KJR-9201 "Shin-Etsu Chemical Co., Ltd.", content 35 mass %)

Fluorescent material: CASN (model number 381-77, peak emission wavelength 660 nm, medium particle size, content 65 mass %)

Outer dimension as seen in a plan view: a square each side (length or width) measuring 1.15 mm
Thickness: 51 μm
Reflective Film 7
Material: $SiO_2$, $Nb_2O_5$
Outer dimension as seen in a plan view: a square each side (length or width) measuring 1.15 mm
Whole thickness: 2 μm

COMPARATIVE EXAMPLE 2

In order to compare against the light emitting device of Examples, a light emitting device of Comparative Example 2 was fabricated. Comparative Example 2 is the light emitting device 100 including the absorbing layer 5 of which pigment concentration is 0%. The constituent components (the light emitting element 1, the base member 2, the light-transmissive member 3, the fluorescent material layer 4, the reflective member 6, the reflective film 7, and the bonding member 8) are common among Comparative Example 2 and Examples 9 to 16. Details of the constituent components in Comparative Example 2 are as described above.

Evaluation of Examples 9 to 16 and Comparative Example 2

The light emitting devices of Examples 9 to 16 and Comparative Example 2 were evaluated. The evaluation result is shown below.

FIG. 12 is a graph showing the relationship between directivity angles and light distribution chromaticity in relation to Examples 9 to 16 and Comparative Example 2. The vertical axis indicates light distribution chromaticity Δx (a displacement amount on the xy chromaticity diagram), and the horizontal axis indicates the directivity angles [°].

As shown in FIG. 12, in relation to Examples 9 to 16 and Comparative Example 2, the absolute value of the light distribution chromaticity became greater as the directivity angle was greater. Further, the absolute value of the light distribution chromaticity was greatest with Comparative Example 2. Further, in relation to Example 15, the absolute value of the light distribution chromaticity inverted from negative to positive around the point where the directivity angle was ±40°. Further, the absolute value of the light distribution chromaticity in Example 12 was about half as great as the absolute value of the of the light distribution chromaticity in Comparative Example 2.

Accordingly, it was found that the chromaticity deviation of the light emitting devices tended to improve as the pigment concentration of the absorbing layer 5 was greater; on the other hand, an excessively great pigment concentration of the absorbing layer 5 invited aggravation. Further, it was found that the chromaticity deviation of the light emitting device improved most when the pigment concentration of the absorbing layer 5 was 0.500%.

Table 2 is a table showing the measurement result of half-power angles [°] in relation to Example 10, Example 12, Example 15, Example 16 and Comparative Example 2.

TABLE 2

| Sample name | Pigment concentration [%] | Half-power angle [°] |
| --- | --- | --- |
| Example 10 | 0.05 | 115.7 |
| Example 12 | 0.10 | 115.4 |
| Example 15 | 0.50 | 112.5 |
| Example 16 | 1.00 | 110.2 |
| Comparative example 1 | 0.00 | 117.0 |

As shown in Table 2, the half-power angle was smallest with Example 16, and greatest with Comparative Example 2. A difference of 6.8[°] in half-power angle was observed between Comparative Example 2 and Example 16.

Figure 13:
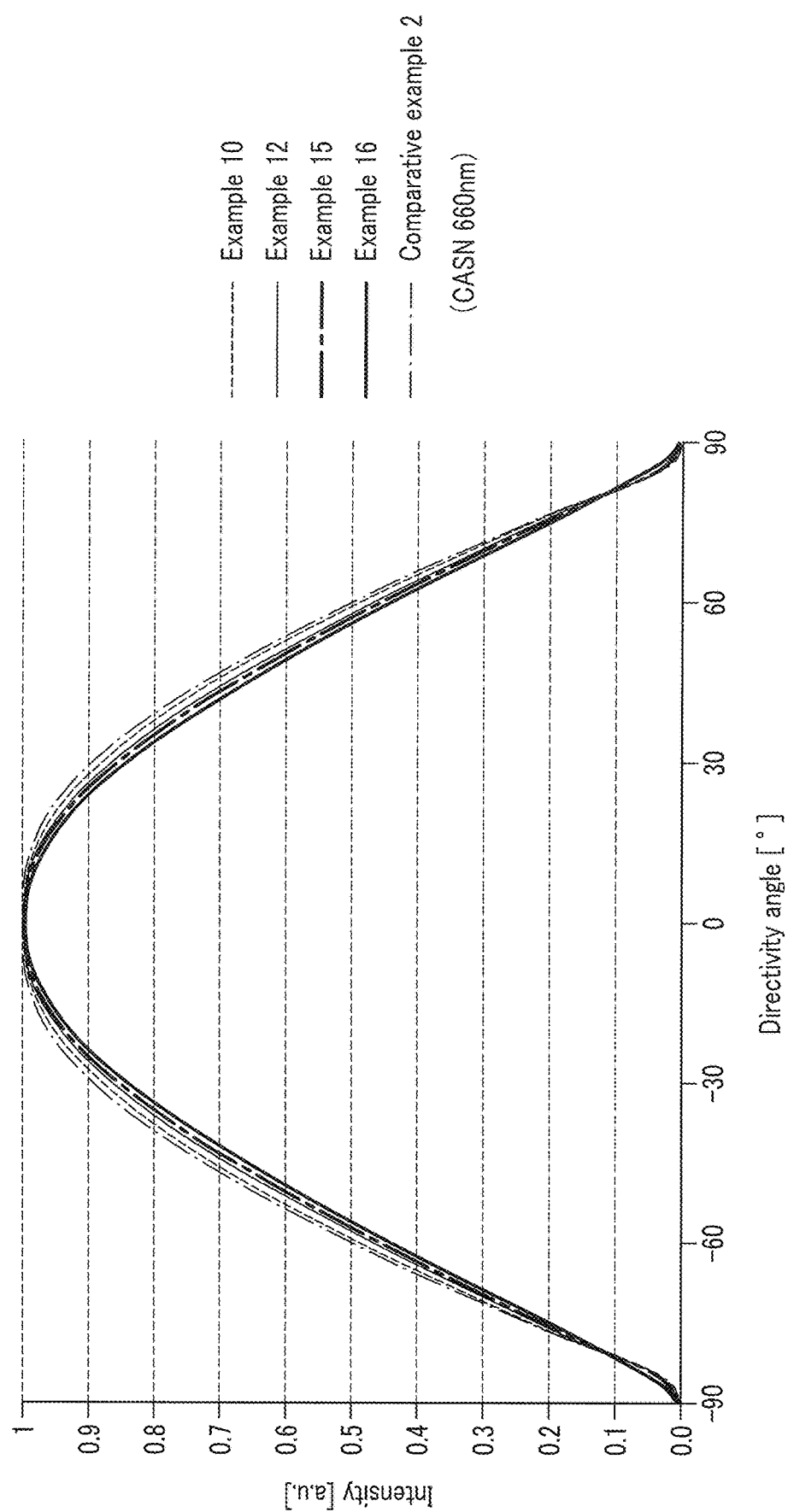
FIG. 13 is a graph showing the relationship between directivity angles and light intensity in relation to Examples 10, 12, 15, 16 and Comparative Example 2.

FIG. 13 is a graph showing the relationship between directivity angles and light intensity in relation to Example 10, Example 12, Example 15, Example 16, and Comparative Example 2. The vertical axis indicates the light intensity Intensity [a.u. (arbitrary unit)], and the horizontal axis indicates directivity angles [°]. In FIG. 13, the broken line represents Example 10, the narrow line represents Example 12, the bold dashed line represents Example 15, the bold line represents Example 16, and the narrow dashed line represents Comparative Example 2.

As shown in FIG. 13, the light intensity became weaker as the directivity angle became greater in Example 10, Example 12, Example 15, Example 16, and Comparative Example 2. Further, the light intensity was weakest with Example 15 and greatest with Comparative Example 2. On the other hand, not much difference was observed as to the light intensity between Example 15 and Comparative Example 2.

From Table 2 and FIG. 13, it was found that, as the pigment concentration of the absorbing layer 5 is greater, the light leakage from the light emitting element 1 in the diagonal direction reduced and, therefore, the half-power angle tended to be narrow. That is, it was found that the color purity of red-color light emitted from the light emitting device 100 enhanced as the pigment concentration of the absorbing layer 5 was greater. Further, it was found that the light intensity of the light emitting device did not much weaken with an increased pigment concentration of the absorbing layer 5. Accordingly, it was found that, by disposing the absorbing layer 5 at the upper surface of the recess 23a of the base member 2, and increasing the pigment concentration of the absorbing layer 5 within a proper range, the light intensity of the light emitting device 100 could be substantially maintained while reducing light leakage of the blue-color light.

Further, comparing FIG. 8 and FIG. 12 against each other, it was found that the light distribution chromaticity was small with Examples 1 to 8 and Comparative Example 1 collectively compared against Examples 9 to 16 and Comparative Example 2. That is, it was found that the fluorescent material layer 4 with a shorter peak emission wavelength tended to improve the chromaticity deviation of the light emitting device 100. Further, the evaluation result of Examples 1 to 8 and Comparative Example 1 and that of Examples 9 to 16 and Comparative Example 2 showed substantially the same tendencies. That is, it was found that, the factor of mini g light leakage from the light emitting element 1 was not the peak emission wavelength at the fluorescent material layer 4 or the thickness of the reflective film 7, but was the pigment concentration of the absorbing layer 5.

Evaluation of Examples 1 to 16 and Comparative Examples 1 and 2

The light emitting devices of Examples (Examples 1 to 16) and the light emitting devices (Comparative Examples 1 and 2) of Comparative Example were evaluated. The evaluation result is shown below.

Table 3 is a table showing the measurement result of color purity [%], chromaticity coordinates (x, y), dominant wavelength λd [nm], and luminous flux φv [lm] in relation to Examples 1 to 16 and Comparative Examples 1 and 2. "Color purity [%]" represents the density of light that the light emitting device emits, "x" represents the x-coordinate in the chromaticity coordinates, "y" represents the y-coordinate in the chromaticity coordinates, "dominant wavelength λd [nm]" represents the wavelength obtained by converting the color of light that the light emitting devices of Examples 1 to 16 and Comparative Examples 1 and 2 emit seen by human eyes into numbers, and "luminous flux φv [lm]" represents the luminosity of light that the light emitting devices of Examples 1 to 16 and Comparative Examples 1 and 2 emit.

TABLE 3

| Sample name | Pigment concentration [%] | Color purity [%] | Chromaticity coordinate x | Chromaticity coordinate y | Dominant wavelength λd [nm] | Luminous flux φv [lm] |
| --- | --- | --- | --- | --- | --- | --- |
| Example 1 | 0.025 | 98.4 | 0.6676 | 0.3270 | 612.4 | 21.1 |
| Example 2 | 0.050 | 98.8 | 0.6710 | 0.3247 | 613.2 | 20.3 |
| Example 3 | 0.075 | 99.1 | 0.6736 | 0.3231 | 613.8 | 19.8 |
| Example 4 | 0.100 | 99.1 | 0.6761 | 0.3208 | 614.6 | 19.0 |
| Example 5 | 0.225 | 99.4 | 0.6726 | 0.3152 | 616.9 | 17.0 |
| Example 6 | 0.350 | 99.4 | 0.6843 | 0.3136 | 617.6 | 16.2 |
| Example 7 | 0.500 | 99.5 | 0.6888 | 0.3095 | 619.5 | 14.5 |
| Example 8 | 1.000 | 99.7 | 0.7003 | 0.2987 | 625.5 | 10.5 |
| Comparative example 1 | 0.000 | 98.6 | 0.6668 | 0.3283 | 611.9 | 21.0 |
| Example 9 | 0.025 | 97.8 | 0.6860 | 0.3066 | 621.2 | 15.1 |
| Example 10 | 0.050 | 98.7 | 0.6898 | 0.3055 | 621.6 | 14.4 |
| Example 11 | 0.075 | 99.1 | 0.6919 | 0.3048 | 622.0 | 14.5 |
| Example 12 | 0.100 | 99.2 | 0.6941 | 0.3032 | 622.8 | 13.6 |
| Example 13 | 0.225 | 99.5 | 0.6977 | 0.3005 | 624.4 | 12.6 |
| Example 14 | 0.350 | 99.6 | 0.7001 | 0.2984 | 625.7 | 11.7 |
| Example 15 | 0.500 | 99.7 | 0.7039 | 0.2949 | 628.0 | 10.1 |
| Example 16 | 1.000 | 99.7 | 0.7079 | 0.2911 | 630.8 | 8.2 |
| Comparative example 2 | 0.000 | 98.6 | 0.6877 | 0.3074 | 620.7 | 14.4 |

The color purity was highest with Example 8 out of Examples 1 to 8 and Comparative Example 1. The color purity exceeded 99% when the pigment concentration was 0.075% or more. Further, the color purity was highest with Example 15 and Example 16 out of Examples 9 to 16 and Comparative Example 2. The color purity exceeded 99% when the pigment concentration was 0.075% or more. Accordingly, it was found that, setting the pigment concentration of the absorbing layer 5 to 0.075% or more, the light emitting device 100 would achieve constant color reproducibility and stabilized hue.

The dominant wavelength λd was smallest with Comparative Example 1 out of Examples 1 to 8 and Comparative Example 1. Further, the dominant wavelength λd was smallest with Comparative Example 2 out of Examples 9 to 16 and Comparative Example 2. Accordingly, it was found that the dominant wavelength λd became greater as the pigment concentration of the absorbing layer 5 was greater. Further, it was found that the light emitting device 100 emitted deep reddish-color light when the peak emission wavelength at the fluorescent material layer 4 was longer.

The luminous flux φv in Examples 1 to 8 and Comparative Example 1 became gradually smaller from Example 2 toward Example 8, and became slightly greater with Example 1 than Comparative Example 1. Further, the luminous flux φv in Examples 9 to 16 and Comparative Example 2 became gradually smaller from Example 11 toward Example 16, and became the same between Example 10 and Comparative Example 2. Accordingly, it was found that the luminous flux φv became smaller as the pigment concentration of the absorbing layer 5 was greater. Further, it was found that the luminous flux φv tended to reduce as the peak emission wavelength at the fluorescent material layer 4 was longer.

Figure 14:
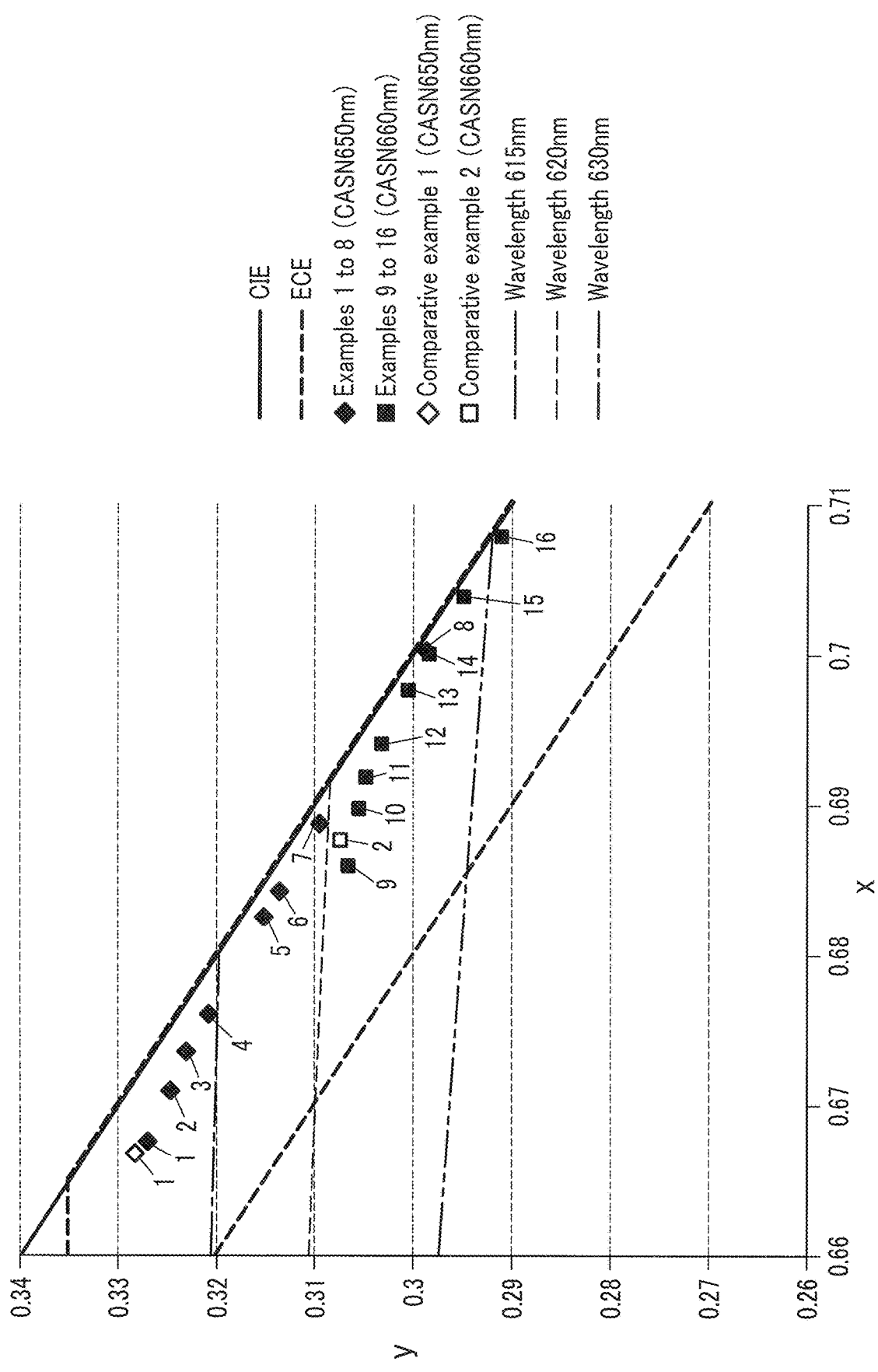
FIG. 14 is a graph showing the xy chromaticity coordinate system of the CIE1931 chromaticity diagram in relation to Examples 1 to 16 and Comparative Examples 1 and 2.

FIG. 14 is a diagram in which the xy chromaticity coordinates in Examples 1 to 16 and Comparative Examples 1 and 2 shown in Table 3 are actually plotted. The vertical axis indicates the y-coordinate, and the horizontal axis indicates the x-coordinate. In FIG. 14, each solid rhombus is a point of plotting the xy chromaticity coordinates in Examples 1 to 8, and each open rhombus is a point of plotting the xy chromaticity coordinates in Comparative Example 1. Further, in FIG. 14, each solid square is a point of plotting the xy chromaticity coordinates in Examples 9 to 16, and each open square is a point of plotting the xy chromaticity coordinates in Comparative Example 2. Further, the solid line represents the CIE, standard, and the broken line represents the ECE standard.

Here, the CIE standard is a universal standard relating to light, illumination, color, color space and the like defined by the International Commission on Illumination. The xy chromaticity coordinates in the light emitting device being closer to the solid line (the CIE standard) mean that the light emitting device more truly shows the ideal color of an object. Further, the ECE standard is a unified standard relating to light distribution, chromaticity and the like employed by major countries including Japan. The xy chromaticity coordinates in the light emitting device being closer to the broken line (the ECE standard) mean that the color purity of red-color light of the light emitting device is higher.

As shown in FIG. 14, the chromaticity coordinates of Example 8 were closest to the CIE standard and the ECE standard out of Examples 1 to 8 and Comparative Example 1. Further, the chromaticity coordinates of Example 16 were closest to the CIE standard and the ECE standard output Examples 9 to 16 and Comparative Example 2. Accordingly, it was found that, with the light emitting device 100, the color purity of red-color light enhanced as the pigment concentration of the absorbing layer 5 was greater, and the range of the color reproduction became greater. Further, it was found that, with the light emitting device 100, light leakage of the blue-color light reduced and color purity of red-color light enhanced as the pigment concentration of the absorbing layer 5 was greater.

Figure 15:
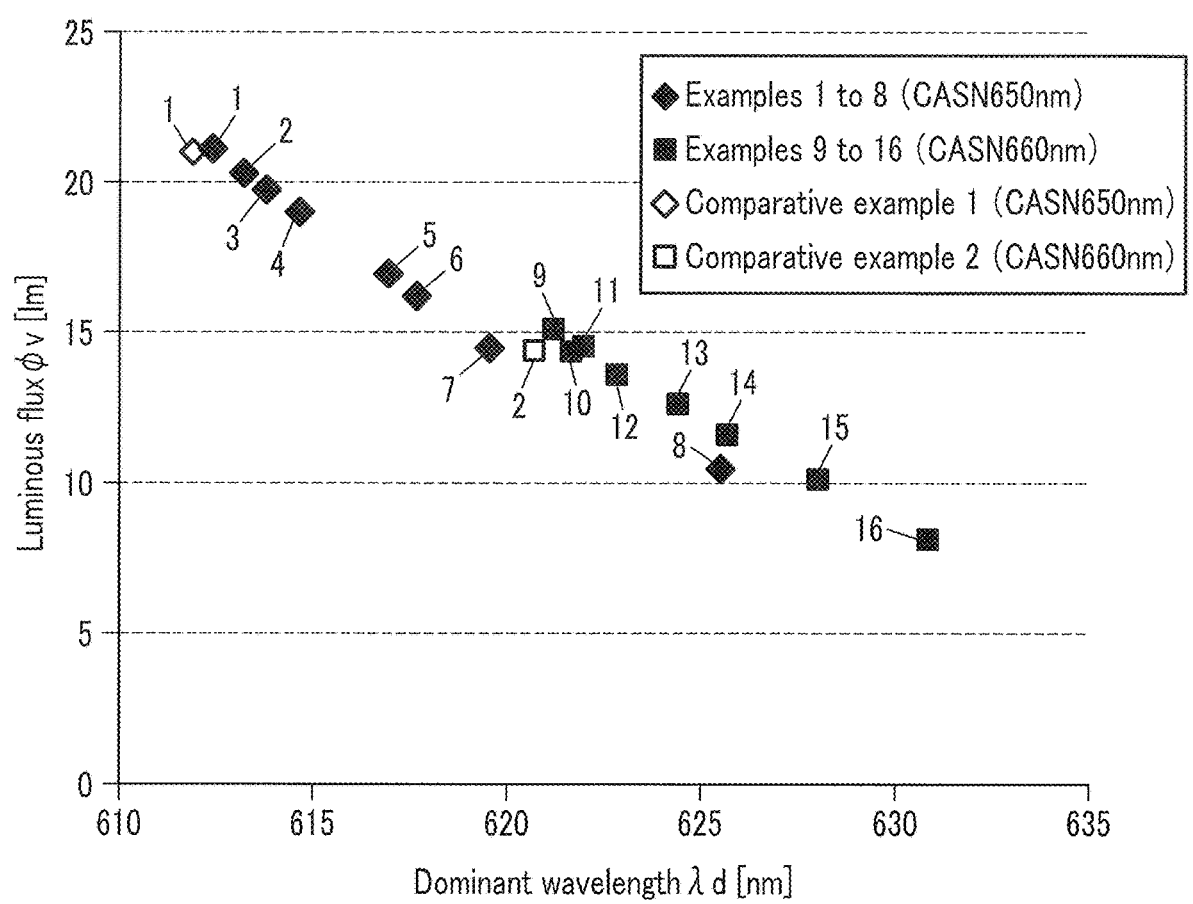
FIG. 15 is a graph showing the relationship between dominant wavelength and luminous flux in Examples 1 to 16 and Comparative Examples 1 and 2.

FIG. 15 is a graph in which the relationship between dominant wavelength λd and luminous flux φv in Examples 1 to 16 and Comparative Examples 1 and 2 shown in Table 3 are actually plotted. The vertical axis indicates luminous flux φv [lm], and the horizontal axis indicates dominant wavelength λd. In FIG. 15, each solid rhombus is a point of plotting the xy chromaticity coordinates in Examples 1 to 8, and each open rhombus is a point of plotting the xy chromaticity coordinates in Comparative Example 1. Further, in FIG. 15, each solid square is a point of plotting the xy chromaticity coordinates in Examples 9 to 16, and each open square is a point of plotting the xy chromaticity coordinates in Comparative Example 2.

As shown in FIG. 15, the luminous flux φv reduced as the dominant wavelength λd was greater in Examples 1 to 8. Further, the luminous flux φv was smallest with Example 8 out of Examples 1 to 8 and Comparative Example 1. Similarly, the luminous flux φv reduced as the dominant wavelength λd was greater in Examples 9 to 16. Further, the luminous flux φv was smallest with Example 16 out of Examples 9 to 16 and Comparative Example 2.

Accordingly, it was found that the dominant wavelength λd tended to become greater as the pigment concentration of the absorbing layer 5 was greater, and the luminous flux φv tended to reduce as the pigment concentration of the absorbing layer 5 was greater. Further, it was found that the luminous flux φv tended to reduce as the peak emission wavelength at the fluorescent material layer 4 was longer.

From all the evaluations described above, it was found that, by disposing the absorbing layer 5 at the upper surface of the recess 23a at the base member 2, in light emitting device 100, the light intensity was substantially maintained while reducing light leakage from the light emitting element 1. Further, it was found that, when the pigment concentration of the absorbing layer 5 was greater, the color purity of red-color light emitted from the light emitting device enhanced, but the luminous flux of the light emitting device disadvantageously reduces.

Further, in the light emitting device, it was found that, in order to maintain the luminous flux while minimizing the chromaticity deviation, it was preferable for the pigment concentration of the absorbing layer 5 to fall within a range of 0.050% to 0.500% inclusive, further preferably 0.075% to 0.350% inclusive, and still further preferably 0.100% to 0.225% inclusive.

In the foregoing, while the specific description has been given based on the modes for carrying out the disclosure, the spirit of the present disclosure is not specified thereto, and must be construed broadly based on the scope of claims. Further, it goes without saying that the present disclosure includes various changes and modifications based on the description provided above.

The light emitting device according to the embodiment of the present disclosure is applicable to a vehicular light emitting device or the like.

What is claimed is:
1. A light emitting device comprising:
   a light emitting element that emits first light;
   a fluorescent material layer disposed on the light emitting element, the fluorescent material layer being excited by the first light to emit second light being longer in wavelength than the first light;
   a reflective film disposed on the fluorescent material layer to reflect the first light and transmit the second light;
   a light-transmissive member disposed on the reflective film; and
   an absorbing layer disposed on the light-transmissive member to absorb the first light.
2. The light emitting device according to claim 1, wherein the reflective film exhibits a reflectivity of 90% or more for the first light when an incident angle of the first light falls within a range of 0° to 30° inclusive.
3. The light emitting device according to claim 1, wherein the reflective film exhibits a reflectivity of 90% or more for light of which wavelength falls within a range of 380 nm to 530 nm inclusive when the incident angle of the first light is 0°.

4. The light emitting device according to claim 1, wherein the first light has a peak emission wavelength in a wavelength range of 420 nm to 480 nm inclusive.

5. The light emitting device according to claim 1, wherein the second light has a peak emission wavelength in a wavelength range of 550 nm to 780 nm inclusive.

6. The light emitting device according to claim 1, wherein the absorbing layer contains at least one of pigment, dye and a second fluorescent material.

7. The light emitting device according to claim 6, wherein the second fluorescent material emits light of which peak emission wavelength falls within a range of 550 nm to 780 nm inclusive.

8. The light emitting device according to claim 6, wherein the pigment and the dye are each red.

9. The light emitting device according to claim 6, wherein the fluorescent material layer and the second fluorescent material are each at least one material selected from the group consisting of a $(Sr,Ca)AlSiN_3$:Eu fluorescent material, a $CaAlSiN_3$:Eu fluorescent material, and a $K_2SiF_6$:Mn fluorescent material, or a combination of the materials belonging to the group.

10. The light emitting device according to claim 6, wherein the pigment contained in the absorbing layer is at least one of perylene-based pigment and titanium nickel antimony-based oxide, or a combination of perylene-based pigment and titanium nickel antimony-based oxide.

11. The light emitting device according to claim 1, wherein
the absorbing layer exhibits a transmittance of 10% or less for light falling within a wavelength range of 420 nm to 480 nm inclusive, and
the absorbing layer exhibits a transmittance of 70% or more for light falling within a wavelength range of 630 nm to 800 nm inclusive.

12. The light emitting device according to claim 1, wherein a content of pigment contained in the absorbing layer falls within a range of 0.05% to 0.5% inclusive relative to a base material of the absorbing layer.

13. The light emitting device according to claim 1, wherein, when a maximum intensity of the light emitting element at a peak emission wavelength is 1, a relative intensity of the light emitting element at a wavelength of 450 nm is 0.1 or less.

14. The light emitting device according to claim 1, further comprising a base member, wherein the light emitting element is disposed at the base member.

15. The light emitting device according to claim 14, wherein
the base member includes a recess,
the light emitting element is disposed at a bottom surface of the recess,
a base material of the base member is ceramic, and
a reflective member is disposed at the recess so as to be in contact with at least the fluorescent material layer and the absorbing layer.

16. The light emitting device according to claim 15, wherein the uppermost surface of the recess is at a position higher than a surface of the absorbing layer.

17. The light emitting device according to claim 15, wherein the reflective member includes at least one light diffusing member selected from the group consisting of zirconium oxide, yttrium oxide, aluminum oxide, aluminum hydroxide, barium carbonate, barium sulfate, magnesium oxide, and magnesium carbonate.

18. The light emitting device according to claim 1, wherein
chromaticity coordinates of light emitted from the light emitting device exist in a quadrangle formed by connecting four points at (x=0.645, y=0.335), (x=0.665, y=0.335), (x=0.735, y=0.265), (x=0.721, y=0.259) in an xy chromaticity coordinate system of a CIE1931 chromaticity diagram.

19. The light emitting device according to claim 1, wherein the reflective film is a dielectric multilayer film.

20. The light emitting device according to claim 1, wherein, as seen in a plan view, the light-transmissive member is formed to be greater in size than the light emitting element.

21. A method of manufacturing a light emitting device, comprising:
providing a light emitting element having a fluorescent material layer formed at its upper surface and having electrodes formed at its lower surface, and a light-transmissive member having a reflective film formed;
mounting the light emitting element on a base member via the electrodes;
disposing the light-transmissive member on the light emitting element so that the reflective film and the fluorescent material layer are in contact with each other; and
disposing an absorbing layer that absorbs light emitted from the light emitting element on the light-transmissive member.

22. The method of manufacturing a light emitting device according to claim 21, further comprising, after the disposing the light-transmissive member on the light emitting element, disposing a reflective member at the base member including a recess so as to cover a lateral surface of the light emitting element.

23. The method of manufacturing a light emitting device according to claim 22, wherein, in the disposing the absorbing layer that absorbs light emitted from the light emitting element on the light-transmissive member, the absorbing layer is disposed so as to cover the reflective member.

24. The method of manufacturing a light emitting device according to claim 21, further comprising separating the base member from the light emitting element.

25. A method of manufacturing a light emitting device, comprising:
providing a light-transmissive member having a reflective film formed on the light-transmissive member and having a fluorescent material layer formed on the reflective film, and a light emitting element having electrodes formed at its lower surface;
mounting the light emitting element on a base member via the electrodes;
disposing the light-transmissive member on the light emitting element so that the fluorescent material layer and an upper surface of the light emitting element are in contact with each other; and
disposing an absorbing layer that absorbs light emitted from the light emitting element on the light-transmissive member.

* * * * *